US006971066B2

(12) United States Patent
Schultz et al.

(10) Patent No.: US 6,971,066 B2
(45) Date of Patent: Nov. 29, 2005

(54) SYSTEM AND METHOD FOR DEPLOYING A GRAPHICAL PROGRAM ON AN IMAGE ACQUISITION DEVICE

(75) Inventors: Kevin L. Schultz, Georgetown, TX (US); Jeffrey L. Kodosky, Austin, TX (US); Hugo Andrade, Austin, TX (US); Brian Keith Odom, Georgetown, TX (US); Cary Paul Butler, Austin, TX (US)

(73) Assignee: National Instruments Corporation, Austin, TX (US)

( * ) Notice: Subject to any disclaimer, the term of this patent is extended or adjusted under 35 U.S.C. 154(b) by 789 days.

(21) Appl. No.: 09/949,783

(22) Filed: Sep. 10, 2001

(65) Prior Publication Data

US 2002/0055947 A1 May 9, 2002

Related U.S. Application Data

(63) Continuation-in-part of application No. 09/891,571, filed on Jun. 25, 2001, now Pat. No. 6,784,903, which is a continuation-in-part of application No. 09/499,503, filed on Feb. 7, 2000, now Pat. No. 6,608,638, which is a continuation-in-part of application No. 08/912,427, filed on Aug. 18, 1997, now Pat. No. 6,219,628.

(51) Int. Cl.[7] .............................................. G09G 5/00

(52) U.S. Cl. ....................... 715/771; 715/763; 715/765; 715/762; 348/207.1; 348/207.11; 348/207.2; 348/222.1

(58) Field of Search ................................ 715/771, 763, 715/762, 765; 382/132, 302, 276, 305; 700/259; 348/211, 207.1, 207.11, 207.2, 222.1

(56) References Cited

U.S. PATENT DOCUMENTS

| 5,309,556 | A | 5/1994 | Sismilich |
| 5,497,498 | A | 3/1996 | Taylor |

(Continued)

FOREIGN PATENT DOCUMENTS

WO  WO 94 10627 A  5/1994

(Continued)

OTHER PUBLICATIONS

Gertz et al., "A Software Architecture-Based Human-Machine Interface for Reconfigurable Sensor-based Control System," In Proceedings of 8th IEEE International Symposium on Intelligent Control, Aug. 25-26, 1993, Chicago, Ill.*

(Continued)

Primary Examiner—Tadesse Hailu
(74) Attorney, Agent, or Firm—Meyertons Hood Kivlin Kowert & Goetzel, P.C.; Jeffrey C. Hood

(57) ABSTRACT

A computer-implemented system and method for deploying a graphical program onto an image acquisition (IMAQ) device. The method may operate to configure an image acquisition (IMAQ) device to perform image processing or machine vision functions, wherein the device includes a programmable hardware element and/or a processor and memory. The method comprises first creating a graphical program which implements the image processing or machine vision function. A portion of the graphical program may be converted into a hardware implementation on a programmable hardware element, and a portion may optionally be compiled into machine code for execution by a CPU. The programmable hardware element is thus configured utilizing a hardware description and implements a hardware implementation of at least a portion of the graphical program. The CPU-executable code may be executed by a computer coupled to the IMAQ device, or by a processor/memory on the IMAQ device.

151 Claims, 19 Drawing Sheets

U.S. PATENT DOCUMENTS

| | | | |
|---|---|---|---|
| 5,535,342 A | | 7/1996 | Taylor |
| 5,541,849 A | | 7/1996 | Rostoker et al. |
| 5,583,749 A | | 12/1996 | Tredennick et al. |
| 5,603,043 A | | 2/1997 | Taylor et al. |
| 5,631,974 A | * | 5/1997 | Lau-Kee et al. ............ 382/132 |
| 5,638,299 A | | 6/1997 | Miller |
| 5,652,875 A | | 7/1997 | Taylor |
| 5,684,980 A | | 11/1997 | Casselman |
| 5,732,277 A | | 3/1998 | Kodosky et al. |
| 5,737,235 A | | 4/1998 | Kean et al. |
| 5,742,504 A | * | 4/1998 | Meyer et al. .................. 700/83 |
| 5,847,953 A | * | 12/1998 | Sojoodi et al. ............... 700/83 |
| 6,006,039 A | * | 12/1999 | Steinberg et al. ............. 396/57 |
| 6,028,611 A | * | 2/2000 | Anderson et al. ........... 345/506 |
| 6,064,409 A | | 5/2000 | Thomsen et al. |
| 6,157,394 A | * | 12/2000 | Anderson et al. ........... 345/506 |
| 6,173,438 B1 | | 1/2001 | Kodosky et al. |
| 6,219,628 B1 | | 4/2001 | Kodosky et al. |
| 6,282,462 B1 | * | 8/2001 | Hopkins ..................... 700/259 |
| 6,298,474 B1 | | 10/2001 | Blowers et al. |
| 6,886,168 B2 | * | 4/2005 | Callaway et al. ........... 719/316 |
| 2004/0183914 A1 | * | 9/2004 | Sliverbrook ............. 348/207.2 |

FOREIGN PATENT DOCUMENTS

| | | |
|---|---|---|
| WO | WO 94 15311 A | 7/1994 |

OTHER PUBLICATIONS

Lindblad et al., "The VuSystem: A Programming System for Compute-Intensive Multimedia," IEEE Journal of Selected Areas in Communications, 1996.*

Olson et al., "Mavis: A Visual Enviropnment for Active Computer Vision," 1992.*

XP0002087124 Xiao-Yu, et al., "Sotware Environment for WASMII: A Data Driven Machine with a Virtual Hardware," Field Programmable Logic Architectures, Synthesis and Applications, 4th International Workshop on Field-Programmable Logic and Applications, FPL '94 Proceedings, Berlin, Germany, 1994.

XP000554820 Edwards, et al., "Software acceleration using programmable hardware devices," IEEE Proceedings: Computers and Digital Techniques, vol. 143, No. 1, Jan. 1996, pp. 55-63.

XP000380758 Lesser, et al, "High Level Synthesis and Generating FPGAs with the BEDROC System," Journal of VLSI Signal Processing, vol. 6, No. 2, Aug. 1993, pp. 191-214.

International Search Report for PCT/US 98/13040 mailed Dec. 22, 1998.

Ade, M; Lauwereins, R; Peperstraete, J.A.; Hardware-Software Codesign with GRAPE, Proceedings of the Sixth IEEE International Workshop on Rapid System Prototyping, pp. 40-47, Jun. 9, 1995.

Lauwereins, R; Engels, M; Ade, M; Peperstraette, J; Grape-II: A System-Level Prototyping Environment for DSP Applications, Computer, vol. 28, Issue 2, pp. 35-43, Feb. 1995.

Lysaght, P; Stockwood, J; A Simulation Tool for Dynamically Reconfigurable Field Programmable Gate Arrays, IEEE Transactions on Very Large Scale Integration Systems, vol. 4, Issue 3, pp. 381-390, Aug. 1996.

De Coster, GRAPE-II: An Introduction [online]. Automatic Control and Computer Architectures Department. Katholieke Universiteit Leuven, Belgium, Feb. 22, 1996 [retrieved Oct. 6, 1999] Retrieved from the Internet @http://www.esat.kuleuven.ac.be/acca.

Weban et al., A Software Development System for FPGA-based Data Acquisition Systems, Proceedings of the IEEE Symposium on FPGAs for Custom Computing Machines, pp. 28-37, Apr. 1996.

Petronino et al., An FPGA-based Data Acquisition System for a 95 GHz. W-band Radar, IEEE International Conference on Acoustics, Soeech and Signal Processing, vol. 5, pp. 4105-4108, Apr. 1997.

Boulay et al., A High Throughput Controller for a 256-Channel Cardiac Potential Overlapping System, Canadian Conference on Electrical and Computer Engineering, vol. 1, pp. 539-542, Sep. 1995.

Collamati et al. "Induction Machine stator Fault On-line Diagnosis Based on LabVIEW Environment", Mediterranean Electrotechnical Conference, vol. 1, p. 495-498, May 1996.

Spoelder et al., "Virtual Instrumentation: A Survey of Standards and Their Interrelation", Proc. IEEE Instr. and Measurement Tech. Conf., vol. 1, pp. 676-681, May 1997.

Srinivasan et al., "LabVIEW program Design for On-Line Data Acquisition and Predictive Maintenance", Proc. Of the 30th Southeastern Symp. On System Theory, pp. 520-524, Mar. 1998.

Wahidanabanu et al., "Virtual Instrumentation with Graphical Programming for Enhanced Detection and Monitoring of Partial Discharges", Proc. Electrical Insulation Conf. 1997, pp. 291-296, Sep. 1997.

Smart Camera Based on FPGA Technology, 11 pages, printed from Internet Website www.gel.ulaval.ca/vision/vlsi/camera on Dec. 28, 2001.

IMAQ Vision Builder Tutorial, National Instruments Corporation, Jan. 1999 Edition.

IMAQ Vision for G Reference Manual, National Instruments Corporation, Jun. 1999 Edition.

* cited by examiner

SYSTEM AND METHOD FOR DEPLOYING A GRAPHICAL PROGRAM ON AN IMAGE ACQUISITION DEVICE

CONTINUATION DATA

This application is a continuation-in-part of U.S. patent application Ser. No. 09/891,571 titled "System and Method for Configuring an Instrument to Perform Measurement Functions Utilizing Conversion of Graphical Programs into Hardware Implementations" filed on Jun. 25, 2001 U.S. Pat. No. 6,784,903, whose inventors are Jeffrey L. Kodosky, Hugo Andrade, Brian Keith Odom, Cary Paul Butler, and Kevin L. Schultz, which is a continuation-in-part of U.S. patent application Ser. No. 09/499,503 titled "System and Method for Configuring a Programmable Hardware Instrument to Perform Measurement Functions Utilizing Estimation of the Hardware Implementation and Management of Hardware Resources", filed on Feb. 7, 2000 U.S. Pat. No. 6,608,638, whose inventors are Jeffrey L. Kodosky, Hugo Andrade, Brian Keith Odom, Cary Paul Butler, and Andrew Mihal, which is a continuation-in-part of U.S. patent application Ser. No. 08/912,427 titled "System and Method for Configuring an Instrument to Perform Measurement Functions Utilizing Conversion of Graphical Programs into Hardware Implementations", filed on Aug. 18, 1997, whose inventors are Jeffrey L. Kodosky, Hugo Andrade, Brian Keith Odom and Cary Paul Butler, which is now U.S. Pat. No. 6,219,628.

FIELD OF THE INVENTION

The present invention relates to graphical programming, and in particular to a system and method for deploying a graphical program onto an image acquisition device. The present invention further relates to a system and method for configuring an image acquisition or machine vision device to perform image processing functions, wherein the instrument or device includes a programmable hardware element and/or a processor and memory.

DESCRIPTION OF THE RELATED ART

Traditionally, high level text-based programming languages have been used by programmers in writing applications programs. Many different high level programming languages exist, including BASIC, C, FORTRAN, Pascal, COBOL, ADA, APL, etc. Programs written in these high level languages are translated to the machine language level by translators known as compilers or interpreters. The high level programming languages in this level, as well as the assembly language level, are referred to as text-based programming environments.

Increasingly computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. The task of programming a computer system to model or implement a process often is further complicated by the fact that a sequence of mathematical formulas, mathematical steps or other procedures customarily used to conceptually model a process often does not closely correspond to the traditional text-based programming techniques used to program a computer system to model such a process. In other words, the requirement that a user program in a text-based programming environment places a level of abstraction between the user's conceptualization of the solution and the implementation of a method that accomplishes this solution in a computer program. Thus, a user often must substantially master different skills in order to both conceptually model a system and then to program a computer to model that system. Since a user often is not fully proficient in techniques for programming a computer system in a text-based environment to implement his model, the efficiency with which the computer system can be utilized to perform such modeling often is reduced.

Examples of fields in which computer systems are employed to interact with physical systems are the fields of instrumentation, process control, industrial automation, and simulation. Computer measurement and control of devices such as instruments or industrial automation hardware has become increasingly desirable in view of the increasing complexity and variety of instruments and devices available for use. However, due to the wide variety of possible testing and control situations and environments, and also the wide array of instruments or devices available, it is often necessary for a user to develop a custom program to control a desired system.

As discussed above, computer programs used to control such systems traditionally had to be written in text-based programming languages such as, for example, assembly language, C, FORTRAN, BASIC, etc. Traditional users of these systems, however, often were not highly trained in programming techniques and, in addition, text-based programming languages were not sufficiently intuitive to allow users to use these languages without training. Therefore, implementation of such systems frequently required the involvement of a programmer to write software for control and analysis of instrumentation or industrial automation data. Thus, development and maintenance of the software elements in these systems often proved to be difficult.

U.S. Pat. Nos. 4,901,221; 4,914,568; 5,291,587; 5,301,301; and 5,301,336; among others, to Kodosky et al disclose a graphical system and method for modeling a process, i.e., a graphical programming environment which enables a user to easily and intuitively model a process. The graphical programming environment disclosed in Kodosky et al can be considered a higher and more intuitive way in which to interact with a computer. A graphically based programming environment can be represented at a level above text-based high level programming languages such as C, Basic, Java, etc.

The method disclosed in Kodosky et al allows a user to construct a diagram using a block diagram editor. The block diagram may include a plurality of interconnected icons such that the diagram created graphically displays a procedure or method for accomplishing a certain result, such as manipulating one or more input variables and/or producing one or more output variables. In response to the user constructing a diagram or graphical program using the block diagram editor, data structures may be automatically constructed which characterize an execution procedure that corresponds to the displayed procedure. The graphical program may be compiled or interpreted by a computer.

Therefore, Kodosky et al teaches a graphical programming environment wherein a user places or manipulates icons and interconnects or "wires up" the icons in a block diagram using a block diagram editor to create a graphical "program." A graphical program for performing an instrumentation, measurement or automation function, such as measuring a Unit Under Test (UUT) or device, controlling or modeling instruments, controlling or measuring a system or process, or for modeling or simulating devices, may be referred to as a virtual instrument (VI). Thus, a user can create a computer program solely by using a graphically based programming environment. This graphically based programming environment may be used for creating virtual instrumentation systems, modeling processes, control, simulation, and numerical analysis, as well as for any type of general programming.

A graphical program may have a graphical user interface. For example, in creating a graphical program, a user may create a front panel or user interface panel. The front panel may include various graphical user interface elements or front panel objects, such as user interface controls and/or indicators, that represent or display the respective input and/or output that will be used by the graphical program or VI, and may include other icons which represent devices being controlled. The front panel may be comprised in a single window of user interface elements, or may comprise a plurality of individual windows each having one or more user interface elements, wherein the individual windows may optionally be tiled together. When the controls and indicators are created in the front panel, corresponding icons or terminals may be automatically created in the block diagram by the block diagram editor. Alternatively, the user can place terminal icons in the block diagram which may cause the display of corresponding front panel objects in the front panel, either at edit time or later at run time. As another example, the front panel may comprise front panel objects, e.g., the GUI, embedded in the block diagram.

During creation of the block diagram portion of the graphical program, the user may select various function nodes or icons that accomplish his desired result and connect the function nodes together. For example, the function nodes may be connected in one or more of a data flow, control flow, and/or execution flow format. The function nodes may also be connected in a "signal flow" format, which is a subset of data flow. The function nodes may be connected between the terminals of the various user interface elements, e.g., between the respective controls and indicators. Thus the user may create or assemble a graphical program, referred to as a block diagram, graphically representing the desired process. The assembled graphical program may be represented in the memory of the computer system as data structures and/or program instructions. The assembled graphical program, i.e., these data structures, may then be compiled or interpreted to produce machine language that accomplishes the desired method or process as shown in the block diagram.

Input data to a graphical program may be received from any of various sources, such as from a device, unit under test, a process being measured or controlled, another computer program, or from a file. Also, a user may input data to a graphical program or virtual instrument using a graphical user interface, e.g., a front panel as described above. The input data may propagate through the data flow block diagram or graphical program and appear as changes on the output indicators. In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators. Alternatively, the front panel may be used merely to view the input and output, or just the output, and the input may not be interactively manipulable by the user during program execution.

Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, simulation, image processing/machine vision applications, and motion control, among others.

A primary goal of graphical programming, including virtual instrumentation, is to provide the user the maximum amount of flexibility to create his/her own applications and/or define his/her own instrument functionality. In this regard, it is desirable to extend the level at which the user is able to program a device, e.g., extend the level at which a user of instrumentation or industrial automation hardware is able to program an instrument. The evolution of the levels at which the user has been able to program an instrument is essentially as follows.

1. User level software (LabVIEW, LabWindows CVI, Visual Basic, etc.)
2. Kernel level software
3. Auxiliary kernel level software (a second kernel running along side the main OS, e.g., InTime, VentureCom, etc.)
4. Embedded kernel level software
5. Hardware level software (FPGA)

In general, going down the above list, the user is able to create software applications which provide a more deterministic real-time response. Currently, some programming development tools for instrumentation or industrial automation provide an interface at level 1 above. In general, most users are unable and/or not allowed to program at the kernel level or auxiliary kernel level.

It would be highly desirable to provide the user with the ability to develop user level software which operates at the embedded kernel level and/or the hardware level. More particularly, it would be desirable to provide the user with the ability to develop high level software, such as graphical programs, which can then be readily deployed onto an image acquisition device, such as a smart camera. This would provide the user with the dual benefits of being able to program device functionality at the highest level possible (e.g., graphical programs), while also providing the ability to have the created program operate directly on an embedded processor or in hardware for increased speed and efficiency.

SUMMARY OF THE INVENTION

One embodiment of the present invention comprises a computer-implemented system and method for deploying a graphical program onto an image acquisition device, such as an image acquisition board coupled to or included in a computer system, or a smart camera. This provides the user the ability to develop or define desired functionality using graphical programming techniques, while enabling the resulting program to operate directly on an image acquisition device, such as a smart camera. The computer-implemented system and method may be used for configuring an image acquisition device or smart camera instrument to perform an image processing or machine vision function, where the image acquisition device (e.g., smart camera) includes at least one functional unit, such as a processor and memory, or a programmable hardware element.

The user may first create a graphical program which performs or represents the desired functionality. The graphical program may comprise a block diagram which includes a plurality of interconnected nodes which visually indicate functionality of the graphical program. The plurality of nodes may be interconnected in one or more of a data flow, control flow, or execution flow format. The graphical program may include a single diagram or a hierarchy of subprograms or sub-diagrams. In one embodiment, the user may place various constructs in portions of the graphical program to aid in conversion of these portions into hardware form. As the user creates or assembles the graphical program on the display, data structures and/or software code may be automatically created and stored in memory corresponding to the graphical program being created. In an image acquisition or analysis application, the graphical program may implement an image processing function. More generally, in a measurement or instrumentation application, the graphical program may implement a measurement function. A portion of the graphical program may also implement a user interface, described below.

Thus, in one embodiment, the graphical program may be created or assembled by the user arranging on a display a plurality of nodes or icons and then interconnecting the nodes to create the graphical program. In response to the user assembling the graphical program, data structures (and/or program instructions) may be created and stored which represent the graphical program. The graphical program may thus comprise a plurality of interconnected nodes or icons which visually indicates the functionality of the program. As noted above, the graphical program may comprise a block diagram and may also include a user interface portion or front panel portion. Where the graphical program includes a user interface portion, the user may assemble the user interface on the display.

In one embodiment, the graphical program may be create on or stored on a computer system. The method may comprise coupling the image acquisition device to the computer system which stores the graphical program, and, where the image acquisition device includes a functional unit, deploying the graphical program onto the functional unit in the image acquisition device to configure the functional unit. After the deployment of the graphical program, the functional unit may be operable to implement the graphical program. In one embodiment, the image acquisition device may be disconnected from the computer system after deploying the graphical program. The image acquisition device may also be coupled to the computer system over a network, and deploying the graphical program may include the computer system deploying the graphical program over the network to the image acquisition device.

In one embodiment, a computer-implemented method for configuring an image acquisition device (or smart camera) to perform an image processing function may include creating a graphical program on a computer system, as described above, where the graphical program implements the image processing function, and where the graphical program comprises a plurality of interconnected nodes which visually indicate functionality of the graphical program; deploying the graphical program on the image acquisition device, where the image acquisition device is coupled to or comprised in the computer system; the image acquisition device acquiring an image of an object; and the image acquisition device executing to perform the image processing function on the image.

In one embodiment, the image acquisition device may include a processor and a memory, and deploying the graphical program on the image acquisition device may include transferring the graphical program to the memory on the image acquisition device, where the image acquisition device executing to perform the image processing function on the image includes the processor in the image acquisition device executing the graphical program from the memory. In one embodiment, deploying the graphical program on the image acquisition device may include generating an executable program, such as a machine language program, based on the graphical program, which implements at least a portion of the functionality of the graphical program; and transferring the executable program to the memory on the image acquisition device. In one embodiment, compiling the graphical program into an executable program may comprise converting the graphical program first into a text-language program, and then compiling the text-language program into the executable program. The image acquisition device executing to perform the image processing function on the image may include the processor in the image acquisition device executing the executable program from the memory.

In one embodiment, the image acquisition device may include a programmable hardware element, and deploying the graphical program on the image acquisition device may include generating a hardware description based on the graphical program, which describes a hardware implementation of the graphical program, and configuring the programmable hardware element in the image acquisition device utilizing the hardware description. After being configured with the hardware description the programmable hardware element may implement a hardware implementation of the graphical program. The image acquisition device executing to perform the image processing function on the image may include the programmable hardware element in the image acquisition device executing to perform the image processing function on the image.

In one embodiment, the image acquisition device may include a processor and a memory and a programmable hardware element. In this embodiment, deploying the graphical program on the image acquisition device may include transferring a first portion of the graphical program to the memory on the image acquisition device; generating a hardware description based on a second portion of the graphical program, which describes a hardware implementation of the graphical program; and configuring the programmable hardware element in the image acquisition device utilizing the hardware description. After being configured, the programmable hardware element may implement a hardware implementation of the second portion of the graphical program. The image acquisition device executing to perform the image processing function on the image may include the processor in the image acquisition device executing the first portion of the graphical program from the memory and the programmable hardware element executing the second portion of the graphical program.

The first and second portions of the graphical program may each include image processing portions. In some embodiments, the first portion of the graphical program may include an image processing portion, and the second portion of the graphical program may include a control portion. In other embodiments, the first portion of the graphical program may include the control portion, and the second portion of the graphical program may include the image processing portion.

In one embodiment, deploying the graphical program on the image acquisition device may include generating an executable program based on a first portion of the graphical program, and which implements functionality of the graphical program; transferring the executable program to the memory on the image acquisition device; generating a hardware description based on a second portion of the graphical program, where the hardware description describes a hardware implementation of the graphical program; and configuring the programmable hardware element in the image acquisition device utilizing the hardware description, where after being configured, the programmable hardware element implements a hardware implementation of the second portion of the graphical program. The image acquisition device executing to perform the image processing function on the image may include the processor in the image acquisition device executing the executable program from the memory and the programmable hardware element executing the second portion of the graphical program.

In one embodiment, the image acquisition device may include a first processor, a second processor, and at least one memory, and the image acquisition device executing to perform the image processing function on the image may include the first processor in the image acquisition device executing a first portion of the graphical program from the at least one memory and the second processor in the image acquisition device executing a second portion of the graphical program from the at least one memory. For example, the first portion of the graphical program may include a first portion of the image processing function, and the second portion of the graphical program may include a second portion of the image processing function.

During execution, a camera associated with the image acquisition device, or comprised in the smart camera, may acquire an image of an object. For example, the image acquisition device or smart camera may be used in a machine vision inspection application, or a manufacturing assembly application. The at least one functional unit in the image acquisition device or smart camera may then receive the acquired image of the object. The at least one functional unit in the image acquisition device or smart camera may then execute to perform the image processing function (or machine vision function) on the image. The results of this image processing may then be used to make a decision in a machine vision inspection application or may be used to perform an operation in a manufacturing assembly application. During execution of the at least one functional unit in the image acquisition device or smart camera, the user interface portion may be presented on a display. A user or operator may use the displayed user interface portion to view or control the image processing function (or machine vision function).

During operation, the image acquisition device may receive an image present signal, where the image acquisition device acquires the image of the object in response to receiving the image present signal. In another embodiment, the image acquisition device may perform a control operation after executing to perform the image processing function on the image. In yet another embodiment, the image acquisition device may generate a pass/fail indication after executing to perform the image processing function on the image. Alternatively, the image acquisition device may determine characteristics of the image after performing the image processing function, and then perform an operation based on the determined characteristics of the image.

In one embodiment, the image acquisition device may be coupled to a camera, and the image acquisition device acquiring an image of an object may include the camera acquiring the image of the object and the image acquisition device receiving and storing the image. Where the image acquisition device is a smart camera, the smart camera incorporates a camera as well as at least one functional unit.

In one embodiment the graphical program includes a user interface portion, and the method may include presenting the user interface portion on a display and/or receiving user input to the user interface portion on the display to control the image acquisition device, during the functional unit in the image acquisition device executing to perform the image processing function on the image. For example, the user interface portion may operate as a front panel for the image acquisition device.

In one embodiment, the method may further include compiling the user interface portion into executable code for execution by a processor and storing the executable code in a memory, and the processor executing the executable code from the memory to present the user interface portion on the display. The processor and memory may be included on the image acquisition device, and the processor in the image acquisition device may execute the executable code from the memory to present the user interface portion on the display during the image acquisition device executing to perform the image processing function on the image. In another embodiment, the processor and the memory may be included on the computer system, and the computer system may execute the executable code from the memory to present the user interface portion on the display during the image acquisition device executing to perform the image processing function on the image.

Thus the method may operate to configure an image acquisition device, such as an image acquisition board or smart camera, with a graphical program to perform image processing or machine vision functions, where the device includes a functional unit, such as a programmable hardware element or processor/memory.

BRIEF DESCRIPTION OF THE DRAWINGS

A better understanding of the present invention can be obtained when the following detailed description of the preferred embodiment is considered in conjunction with the following drawings, in which.

Figure 1:
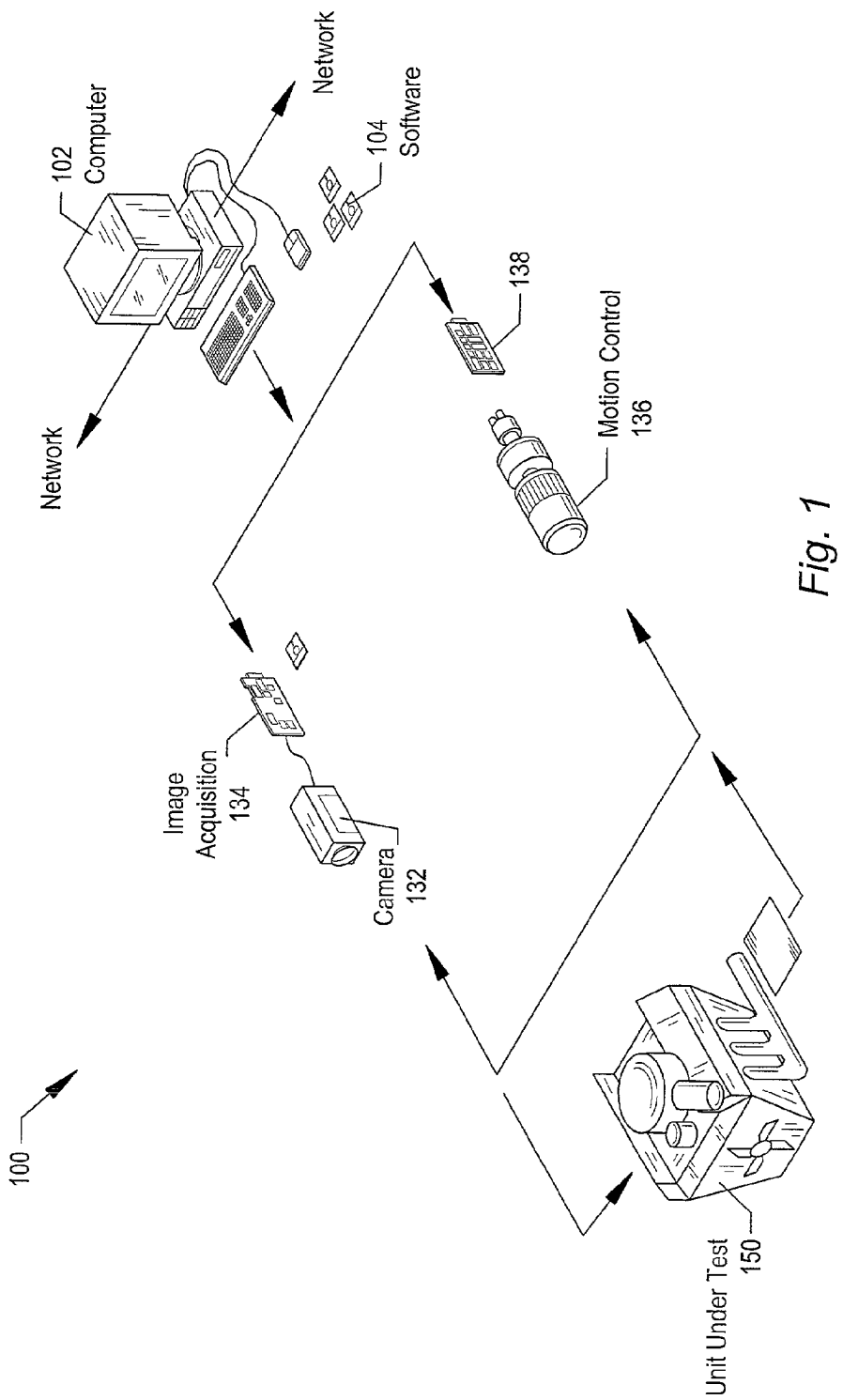
FIG. 1 illustrates an image acquisition/machine vision system according to one embodiment of the invention.

While the invention is susceptible to various modifications and alternative forms specific embodiments are shown by way of example in the drawings and will herein be described in detail. It should be understood however, that drawings and detailed description thereto are not intended to limit the invention to the particular form disclosed. But on the contrary the invention is to cover all modifications, equivalents and alternative following within the spirit and scope of the present invention as defined by the appended claims.

DETAILED DESCRIPTION OF THE EMBODIMENTS

Incorporation by Reference

The following U.S. Patents and patent applications are hereby incorporated by reference in their entirety as though fully and completely set forth herein.

U.S. Pat. No. 4,914,568 titled "Graphical System for Modeling a Process and Associated Method," issued on Apr. 3, 1990.

U.S. Pat. No. 6,219,628 titled "System and Method for Configuring an Instrument to Perform Measurement Functions Utilizing Conversion of Graphical Programs into Hardware Implementations".

U.S. Pat. No. 6,173,438 titled "Embedded Graphical Programming System" filed Aug. 18, 1997, whose inventors are Jeffrey L. Kodosky, Darshan Shah, Samson DeKey, and Steve Rogers.

U.S. patent application Ser. No. 09/499,503 titled "System and Method for Configuring a Programmable Hardware Instrument to Perform Measurement Functions Utilizing Estimation of the Hardware Implementation and Management of Hardware Resources", filed on Feb. 7, 2000, whose inventors are Jeffrey L. Kodosky, Hugo Andrade, Brian Keith Odom, Cary Paul Butler, and Andrew Mihal.

U.S. patent application Ser. No. 09/891,571 titled "System and Method for Configuring an Instrument to Perform Measurement Functions Utilizing Conversion of Graphical Programs into Hardware Implementations" filed on Jun. 25, 2001, whose inventors are Jeffrey L. Kodosky, Hugo Andrade, Brian Keith Odom, Cary Paul Butler, and Kevin L. Schultz.

U.S. patent application Ser. No. 09/745,023 titled "System and Method for Programmatically Generating a Graphical Program in Response to Program Information," filed Dec. 20, 2000, whose inventors are Ram Kudukoli, Robert Dye, Paul F. Austin, Lothar Wenzel and Jeffrey L. Kodosky.

U.S. patent application Ser. No. 09/595,003 titled "System and Method for Automatically Generating a Graphical Program to Implement a Prototype", filed Jun. 13, 2000, whose inventors are Nicolas Vazquez, Jeffrey L. Kodosky, Ram Kudukoli, Kevin L. Schultz, Dinesh Nair, and Christophe Caltagirone.

U.S. patent application Ser. No. 09/587,682 titled "System and Method for Automatically Generating a Graphical Program to Perform an Image Processing Algorithm", filed on Jun. 5, 2000, whose inventors are Nicolas Vazquez, Jeffrey L. Kodosky, Ram Kudukoli, Kevin L. Schultz, Dinesh Nair and Christophe Caltagirone.

The LabVIEW and BridgeVIEW graphical programming manuals, including the "G Programming Reference Manual", available from National Instruments Corporation, are also hereby incorporated by reference in their entirety. ps FIG. 1—Image Acquisition or Machine Vision System FIG. 1 illustrates a host computer system 102 coupled to an image acquisition device 134. As used herein, the term "image acquisition device" is intended to include any of various types of devices that are operable to acquire and/or store an image. An image acquisition device may also optionally be further operable to analyze or process the acquired or stored image. Examples of an image acquisition device include an image acquisition (or machine vision) card (also called a video capture board), a device external to a computer that operates similarly to an image acquisition card, a smart camera, a robot having machine vision, and other similar types of devices.

As used herein, the terms "image processing" and "machine vision" are used interchangeably to refer to the processing of images to extract useful information from the image or determine characteristics of the image (or to determine characteristics of one or more objects displayed in the image). The term "image processing" is used herein to refer to both "image processing" and "machine vision", to the extent these terms have different meanings. The term "image processing function" includes tools such as edge detection, blob analysis, pattern matching, and other image processing functions. The term "image processing function" may also include an operation or decision that is performed in response to the information extracted or characteristics determined from the image. The term "image processing function" is also intended to include an image processing (or machine vision) algorithm that combines a sequence of two or more image processing functions or tools and/or decision operations that process an image in a desired way or which implement an image processing or machine vision application, such as part inspection, automated assembly, image analysis, pattern matching, edge detection, etc.

Thus, FIG. 1 illustrates an exemplary image acquisition or machine vision system 100. As FIG. 1 shows, the image acquisition device 134 may in turn couple to or comprise a camera 132. The image acquisition device 134 may include a functional unit for performing an image processing function as described below.

The host computer 102 may comprise a CPU, a display screen, memory, and one or more input devices such as a mouse or keyboard as shown. The computer 102 may operate with the image acquisition device to analyze, measure or control a device or process 150. Alternatively, the computer 102 may be used only to configure a functional unit in the image acquisition device.

As used herein, the term "functional unit" may include a processor and memory or a programmable hardware element. The term "functional unit" may include one or more processors and memories and/or one or more programmable hardware elements. As used herein, the term "processor" is intended to include any of types of processors, CPUs, microcontrollers, or other devices capable of executing software instructions. As used herein, the term "programmable hardware element" is intended to include various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware.

As shown, video device or camera 132 may be coupled to the computer 102 via the image acquisition device or card 134. The camera 132 and/or image acquisition device 134 may couple to the computer 102 through a serial bus, a network, or through other means.

The image acquisition system 100 may be used in an manufacturing assembly, test, measurement, and/or control application, among others. For illustration purposes, a unit under test (UUT) 150 is shown which may be positioned by a motion control device 136 (and interface card 138), and imaged and analyzed by the camera 132 and image acquisition device 134. It is noted that in various other embodiments the UUT 150 may comprise a process or system to be measured and/or analyzed.

Referring again to FIG. 1, the computer 102 may include a memory medium on which computer programs, e.g., graphical programs, according to the present invention may be stored. As used herein, the term "memory medium" includes a non-volatile medium, e.g., a magnetic media or hard disk, or optical storage; a volatile medium, such as computer system memory, e.g., random access memory (RAM) such as DRAM, SRAM, EDO RAM, RAMBUS RAM, DR DRAM, etc.; or an installation medium, such as a CD-ROM or floppy disks 104, on which the computer programs according to the present invention may be stored for loading into the computer system. The term "memory medium" may also include other types of memory or combinations thereof.

The memory medium may be comprised in the computer 102 where the programs are executed or may be located on a second computer which is coupled to the computer 102 through a network, such as a local area network (LAN), a wide area network (WAN), or the Internet. In this instance, the second computer operates to provide the program instructions through the network to the computer 102 for execution.

The software programs of the present invention may be stored in a memory medium of the respective computer 102, or in a memory medium of another computer, and executed by the CPU. The CPU executing code and data from the memory medium thus comprises a means for deploying a graphical program onto an image acquisition device, e.g., a smart camera, according to the steps described below.

The memory medium may store a graphical programming development system for developing graphical programs. The memory medium may also store one or more computer programs which are executable to deploy a graphical program, such as by converting at least a portion of a graphical program into a form for configuring or programming a programmable hardware element, by executing the graphical program natively on a processor, or by converting the graphical program to a different form for execution by a processor and memory. The image acquisition device 134 in FIG. 1 may be controlled by or configured by graphical software programs which are deployed or downloaded to the functional unit on the device 134.

As described below, in one embodiment the graphical program may be deployed by either one or more of: 1) converting the graphical program (or a portion thereof) into a hardware implementation and configuring the programmable hardware element with this hardware implementation, 2) transferring the graphical program (or a portion thereof) to a memory of the functional unit for execution by a processor (wherein the processor may execute a graphical program execution engine and optionally a real time operating system), or 3) compiling the graphical program (or a portion thereof) into an executable program and transferring the executable program to a memory of the functional unit for execution by a processor (wherein the processor may optionally execute a real time operating system).

In the present application, the term "graphical program" or "block diagram" is intended to include a program comprising graphical code, e.g., two or more nodes or icons interconnected in one or more of a data flow, control flow, or execution flow format, where the interconnected nodes or icons may visually indicates the functionality of the program. Thus the terms "graphical program" or "block diagram" are each intended to include a program comprising a plurality of interconnected nodes or icons which visually indicates the functionality of the program. A graphical program may comprise a block diagram and may also include a user interface portion or front panel portion. The user interface portion may be contained in the block diagram or may be contained in one or more separate panels or windows. A graphical program may be created using any of various types of systems which are used to develop or create graphical code or graphical programs, including LabVIEW, DASYLab, and DiaDem from National Instruments, Visual Designer from Intelligent Instrumentation, Agilent VEE (Visual Engineering Environment), Snap-Master by HEM Data Corporation, SoftWIRE from Measurement Computing, ObjectBench by SES (Scientific and Engineering Software), Simulink from the MathWorks, WiT from Coreco, Vision Program Manager from PPT Vision, Hypersignal, VisiDAQ, VisSim, and Khoros, among others. In the preferred embodiment, the system uses the LabVIEW graphical programming system available from National Instruments.

Figure 2A:
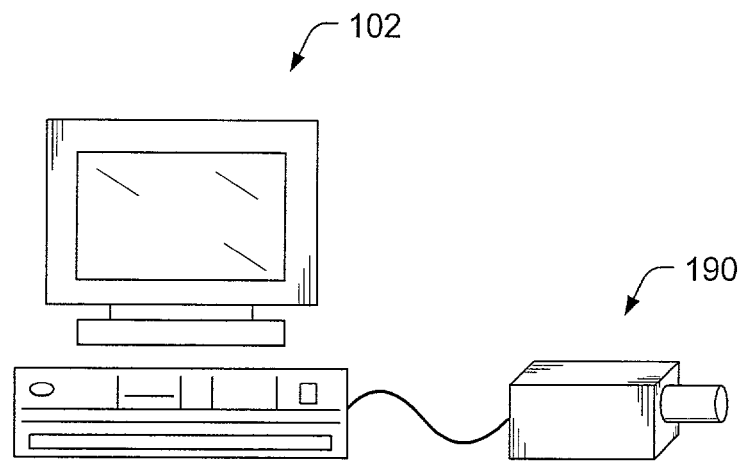
FIG. 2A illustrates a computer system coupled to a smart camera according to one embodiment of the invention.
Figure 2B:
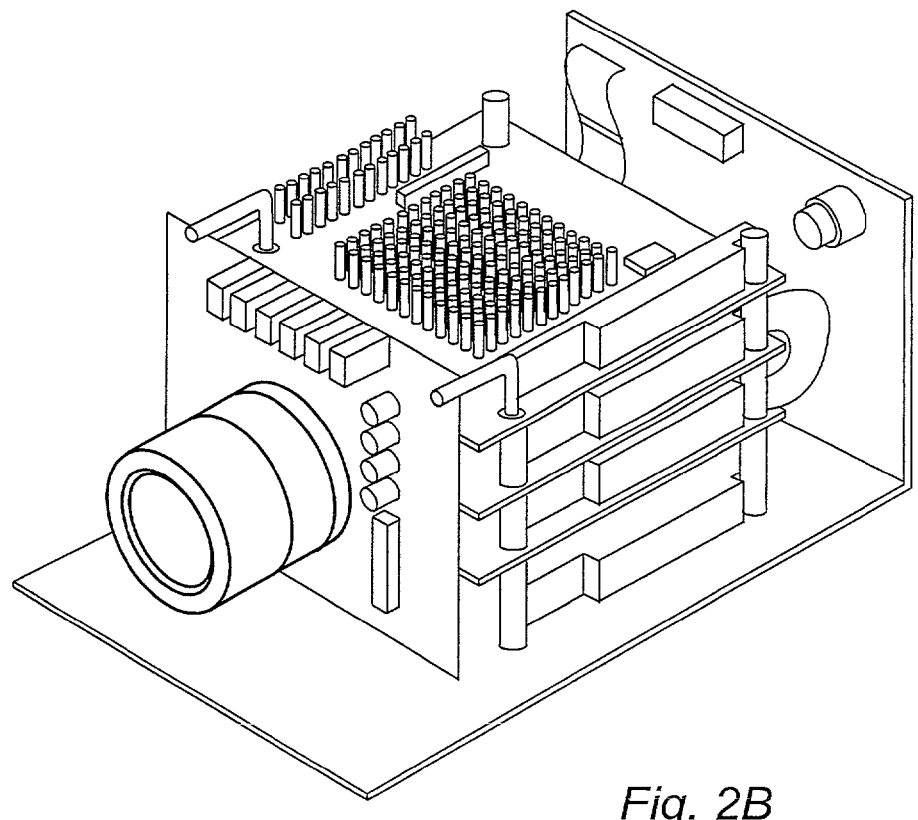
FIG. 2B illustrates a smart camera, according to one embodiment of the invention.

FIGS. 2A and 2B—Image Acquisition System Having a Smart Camera

FIGS. 2A and 2B illustrate an image acquisition system with a smart camera. As FIGS. 2A and 2B illustrate, a smart camera may include a housing which encloses a portion or all of the smart camera components, or may be comprised on a frame which primarily provides structural support for the smart camera components.

FIG. 2A—Image Acquisition System with Smart Camera

FIG. 2A illustrates an image acquisition system comprising computer system 102 coupled to a smart camera 190. The smart camera is an example of an image acquisition device. As used herein, the term "smart camera" is intended to include any of various types of devices that include a camera or other image sensor and a functional unit capable of being configured to perform an image processing function to analyze or process an acquired image. For example, while traditional computer vision is based on a camera/computer system in which the image processing or understanding algorithm is embedded in the computer 102, the computational load of vision algorithms may be circumvented or mitigated by merging low level processing with the camera or sensor in a single module. For example, a hardware architecture may be defined in a Hardware Description Language (e.g., VHDL), simulated and synthesized into digital structures that can then be configured in a Field Programmable Gate Array (FPGA). In one application of a smart camera, the flexibility of an FPGA may be combined with a sensor for real time image processing. In another application of a smart camera, the flexibility of a processor and memory may be combined with a sensor for real time image processing. Examples of smart cameras include: NAVSYS Corporation's GI-EYE, which generates digital image data that are automatically tagged with geo-registration meta-data to indicate the precise position and attitude of the camera when the image was taken; Vision Components' GmbH Smart Machine Vision Cameras, which integrate a high-resolution Charge Coupled Device (CCD) sensor with a fast image-processing signal processor, and provide various interfaces to allow communication with the outside world; and Visual Inspection Systems' SMART cameras with on-board DSP capabilities, including frame grabbers and robot guidance systems, among others.

The computer system 102 shown in FIG. 2A may include a memory medium. As noted above, the memory medium may store a graphical programming development system for developing graphical programs. The graphical programming development system may be used to develop a graphical program that implements an image processing function. In this example, one or more of the nodes in the graphical program may implement or represent an image processing function.

The memory medium may also store one or more computer programs which are executable to convert at least a portion of a graphical program into a form for configuring a functional unit comprised in the smart camera 190.

As mentioned above, the smart camera 190 may include a functional unit, which may be a programmable hardware element (programmable or reconfigurable hardware), e.g., an FPGA, and/or may be a processor and memory. The functional unit in the smart camera 190 may be configured with a graphical program that implements the image processing function. The smart camera 190 may also comprise a camera coupled to the functional unit. The smart camera 190 may also include a memory (a memory medium) coupled to the camera that stores an acquired image. If the smart camera 190 includes an analog camera, the smart camera 190 may further include analog to digital (A/D) logic for converting analog image signals into a digital image for storage in the memory. The smart camera 190 may also optionally include timer/counter logic that may perform timing/counting operations, e.g., during operation of the functional unit. As FIG. 2A shows, in one embodiment, the smart camera may include a housing which encloses some or all of the components of the smart camera. Various embodiments of the smart camera 190 are shown in FIGS. 6A–6D, described below.

FIG. 2B—Smart Camera

FIG. 2B illustrates another embodiment of a smart camera 190. As FIG. 2B shows, the smart camera includes a camera, coupled to circuitry/logic (e.g., one or more circuit boards) for performing various image processing and/or acquisition functions. As mentioned above, the circuitry/logic may include a functional unit, such as a programmable hardware element, e.g., an FPGA and/or a processor and memory. As also described above, the functional unit in the smart camera 190 may be configured with a graphical program that implements the image processing function, and may also include a memory coupled to the camera for storing an acquired image. If the camera is an analog camera, the smart camera 190 may further include analog to digital (A/D) logic for converting analog image signals into a digital image for storage in the memory. The smart camera 190 may also optionally include timer/counter logic that may perform timing/counting operations, e.g., during operation of the programmable hardware element. The smart camera 190 may also include various I/O ports for communicating with external devices, such as computer system 102. As FIG. 2B shows, in one embodiment, the smart camera may include a frame or structure to support the components comprised in the smart camera. In one embodiment, the smart camera may include a "PC-on-a-Card" which may provide part or all of the functionality of a personal computer. Various embodiments of the smart camera 190 are shown in FIGS. 6A–6D, described below.

Figure 3A:
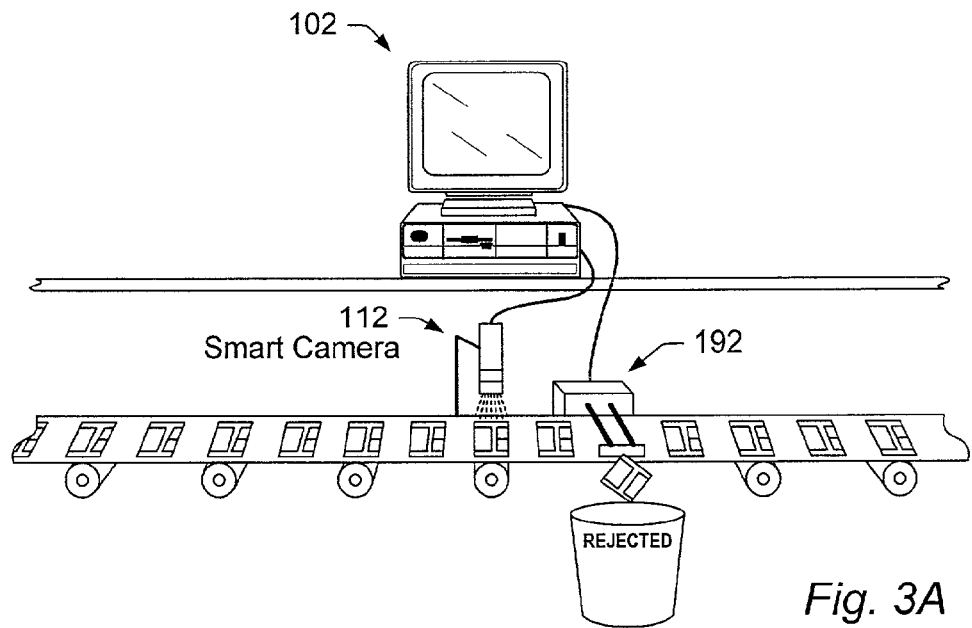
FIGS. 3A and 3B illustrate image processing/machine vision systems according to embodiments of the invention.
Figure 3B:
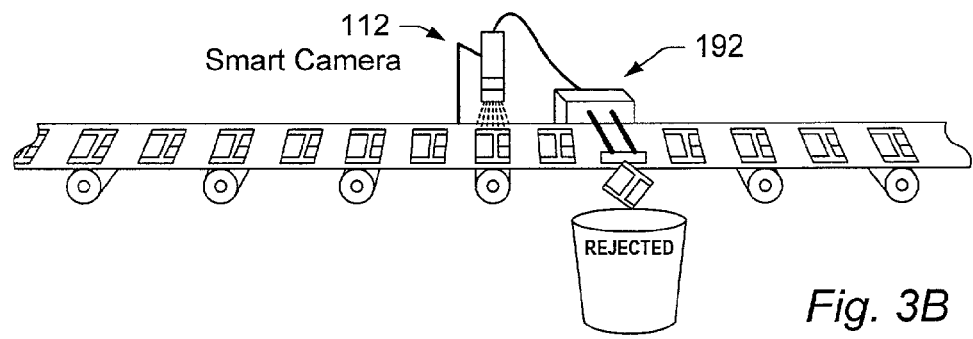

FIGS. 3A and 3B—Image Processing Systems

FIGS. 3A and 3B illustrate image processing or machine vision systems according to various embodiments of the invention. The image processing system of FIG. 3A may comprise a computer 102 and a smart camera 190, and may further include a motion control device 192. The image processing system of FIG. 3B may comprise smart camera 190 and motion control device 192, and may not include computer system 102.

The smart camera 190 may include a digital camera that acquires a digital video signal which comprises an image, or a sequence of images, or other data desired to be acquired. In one embodiment, the smart camera 190 may instead include an analog camera that acquires an analog video signal, and the smart camera 190 may further include A/D converters for converting the analog video signal into a digital image.

The smart camera 190 may include a functional unit configured according to a graphical program. For example, the functional unit may be configured to perform an image processing function as represented by a graphical program. Thus a graphical program may have been first created to perform the image processing function, such as with a graphical development environment on the computer system 102, and the graphical program may then have been deployed onto the functional unit of the smart camera to implement the image processing function.

In the machine vision system of FIG. 3A, the digital video signal or digital image may be provided to the functional unit in the smart camera 190, wherein the image processing function is performed.

In the embodiment of FIG. 3A, the functional unit in the smart camera 190 may perform a portion or all of the image processing function, and the computer 102 may perform a portion of the image processing function. For example, the functional unit in the smart camera 190 may perform the actual processing of the image to determine characteristics of the image, and the computer 102 may then perform an operation based on this result, such as rejecting a part from an assembly line, or logging the results to file. As another example, the functional unit in the smart camera 190 may perform the processing of the image to determine characteristics of the image, and may also optionally perform an operation based on this result, and the computer system 102 may execute software to provide a user interface for the system, e.g., the computer system 102 may execute a user interface portion of a graphical program, where the block diagram of the graphical program is used to configure the functional unit in the smart camera 190. Thus, in one embodiment, a first portion of the graphical program, e.g., DSP functions requiring real time performance, may be executed by the smart camera, i.e., the functional unit, and a second portion of the graphical program, e.g., a user interface where real time performance is not required, may be executed by the computer system 102.

In the embodiment of FIG. 3B, the functional unit in the smart camera 190 may perform all of the desired image processing function, including optionally performing an operation based on determined characteristics of the image, and hence the computer system 102 is not necessary during operation of the system. In another embodiment, the smart camera 190 may include a processor and memory (in addition to the functional unit which executes the image processing function) which may execute the second portion of the graphical program, e.g., the user interface portion.

In the embodiments of FIGS. 3A and 3B, the functional unit in the smart camera 190 (or the computer system 102 in FIG. 3A) may control the motion control device 192. In an alternate embodiment, the motion control device 192 may also include a functional unit that has been configured with a graphical program. The functional unit in the motion control device 192 may be configured to perform a motion control function. Thus a graphical program may have been first created that performs the motion control function, and the graphical program may then have been deployed onto the motion control device 192 as described herein. Examples of motion control functions include moving a part or object to be imaged by a camera, rejecting a part on an assembly line, or placing or affixing components on a part being assembled, or a robotics application, among others.

Figure 4:
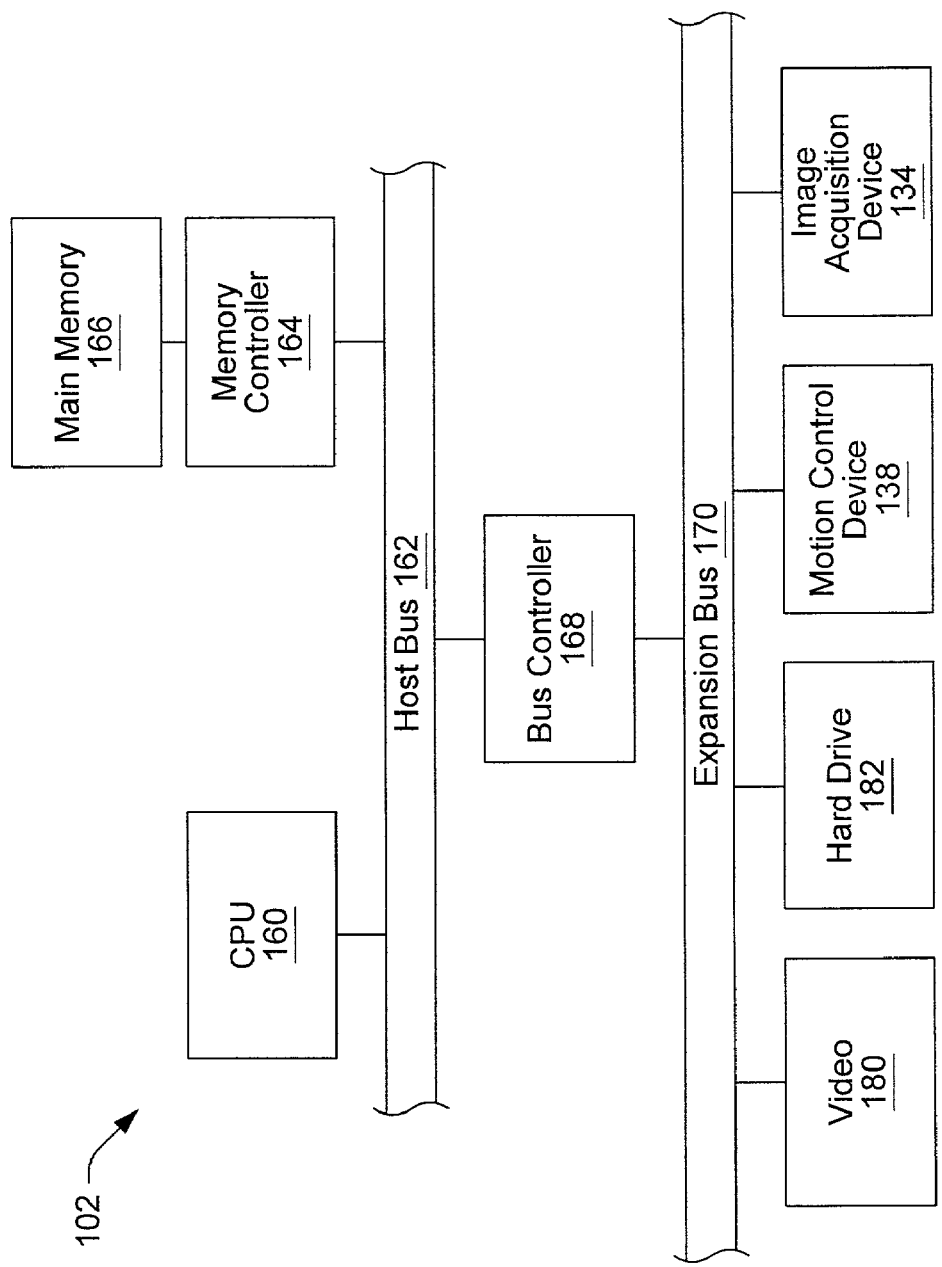
FIG. 4 is a block diagram of the computer system of FIGS. 1, 2A, and 3A.

FIG. 4—Computer Block Diagram

FIG. 4 is an exemplary block diagram of the computer 102 of FIGS. 1, 2A, and 3A. The elements of a computer not necessary to understand the operation of the present invention have been omitted for simplicity. The computer 102 may include at least one central processing unit (CPU) or processor 160 which is coupled to a processor or host bus 162. The CPU 160 may be any of various types, including an x86 processor, a PowerPC processor, a CPU from the Motorola family of processors, a CPU from the SPARC family of RISC processors, as well as others. Main memory 166 is coupled to the host bus 162 by means of memory controller 164. The main memory 166 stores a graphical programming system, and also stores software for deploying at least a portion of a graphical program onto an image acquisition device 134. This software will be discussed in more detail below. The main memory 166 may also store operating system software, i.e., software for operation of the computer system, as well as one or more application programs, as is well known to those skilled in the art.

The host bus 162 is coupled to an expansion or input/output bus 170 by means of a bus controller 168 or bus bridge logic. The expansion bus 170 is preferably the PCI (Peripheral Component Interconnect) expansion bus, although other bus types may be used. The expansion bus 170 may include slots for various devices, the examples shown including a motion control device 138 and an image acquisition device 134, as described above in reference to FIG. 1. The computer 102 may further comprise a video display subsystem 180 and hard drive 182 coupled to the expansion bus 170, also shown.

One or more of the interface cards or devices (e.g., those shown in FIGS. 1, 2A, 2B, 3A and/or 3B) may be coupled to or comprised in the computer 102 and may comprise a functional unit, such as a programmable hardware element (FPGA) and/or processor and memory. The computer 102 may also include a network interface for coupling to a network, wherein the target device containing the functional unit may be coupled to the network. Thus the computer 102 may be used for configuring a functional unit hardware in a target device over a network.

FIGS. 5A–5D—Image Acquisition Device Hardware Diagram

Figure 5A:
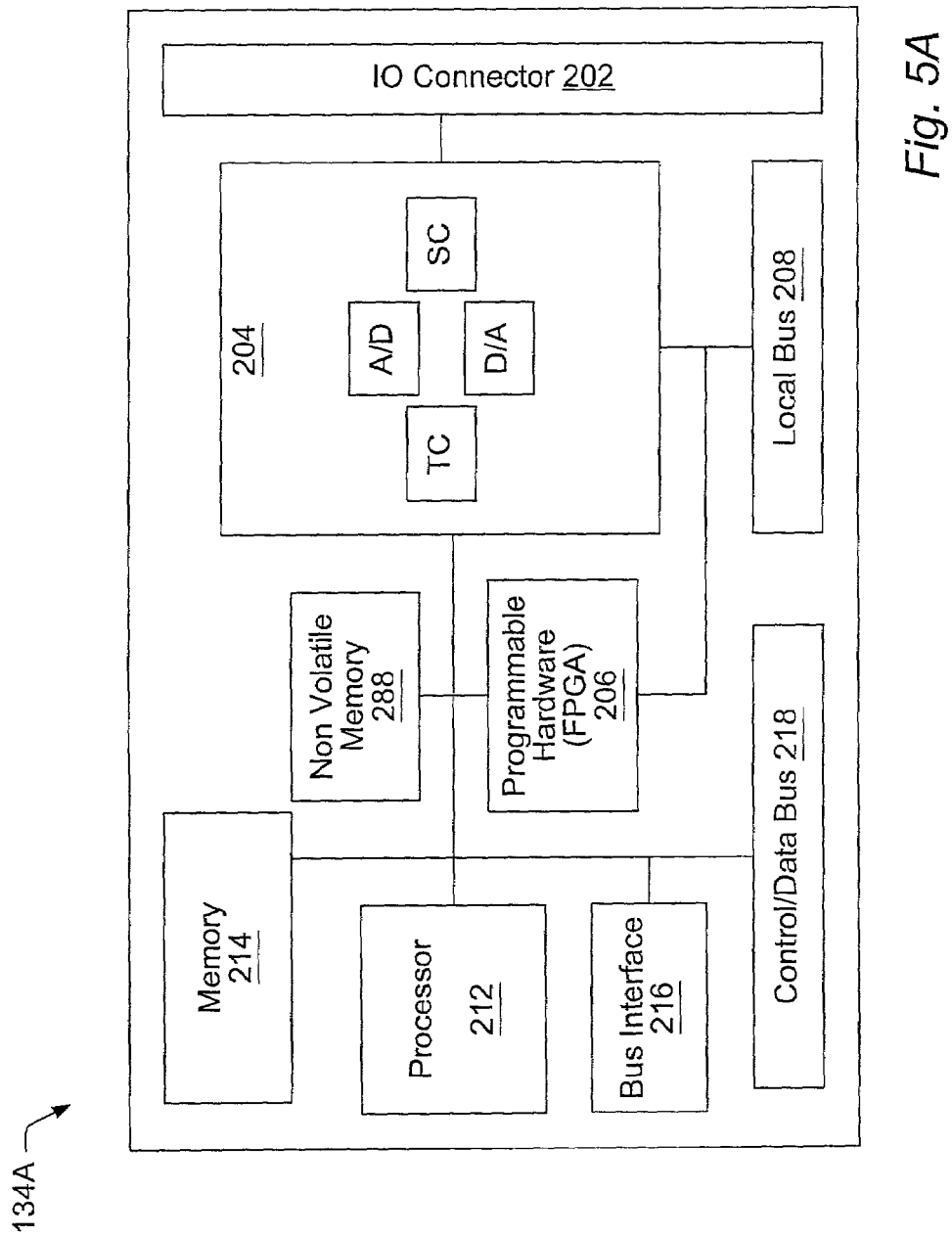
FIGS. 5A, 5B and 5C are block diagrams illustrating an interface card or device configured with a programmable hardware element and/or a processor and memory, according to various embodiments of the present invention.

FIG. 5A is a block diagram illustrating a device, e.g., an interface card 134A, configured with programmable hardware according to one embodiment. It is noted that FIG. 5A is exemplary only, and an interface card or device configured with programmable hardware according to the present invention may have various architectures or forms, as desired. For example, the device may be internal or external to the computer 102, and may be connected to the computer through a network, such as the Internet. The interface card 134A illustrated in FIG. 5A may be the image acquisition device 134 or the motion control interface card 138, shown in FIGS. 1–3.

As shown in FIG. 5A, the interface card 134A may include an I/O connector 202 which is operable to send/receive signals. The I/O connector 202 may present analog and/or digital connections for receiving/providing analog or digital signals, such as image signals or pixel data. In one embodiment, the I/O connector 202 may be adapted for coupling to an external camera.

The interface card 134A may also include data acquisition (DAQ) logic 204. As shown, the data acquisition logic 204 may comprise analog to digital (A/D) converters, digital to analog (D/A) converters, timer counters (TC) and signal conditioning (SC) logic as shown. The DAQ logic 204 may provide data acquisition functionality of the image acquisition card 134A. In one embodiment, the DAQ logic 204 comprises 4 A/D converters, 4 D/A converters, 23 digital I/Os, a RTSI connector, and a TIO. This extra hardware is useful for signal processing and motion control applications. The functional unit, e.g., programmable hardware element or FPGA 206 and/or processor 212 may access these resources directly, thereby enabling creation of very image processing applications, among others.

In the embodiment of FIG. 5A, the functional unit of the interface card 134A may include a programmable hardware element 206 and a processor 212 and memory 214. In one embodiment, the programmable hardware 206 may comprise a field programmable gate array (FPGA) such as those available from Xilinx, Altera, etc. The programmable hardware element 206 may be coupled to the DAQ logic 204 and may also be coupled to a local bus interface 208, described below. Thus a graphical program can be created on the computer 102, or on another computer in a networked system, and at least a portion of the graphical program can be converted into a hardware implementation form for execution in the FPGA 206. The portion of the graphical program converted into a hardware implementation form is preferably a portion which requires fast and/or real time execution.

In the embodiment of FIG. 5A, the interface card 134A may further include a dedicated on-board processor 212 and memory 214. This enables a portion of the graphical program to be compiled into machine language for storage in the memory 214 and execution by the processor 212. A portion of the graphical program may also (or instead) be transferred to the memory 214 in its native format for execution by the processor. This may be in addition to a portion of the graphical program being converted into a hardware implementation form in the FPGA 206. The memory 214 may store a real time operating system (RTOS) for execution by the processor 212. Where the graphical program executes in its native format on the device 134A, the memory may also store a graphical program execution engine that is executed by the processor 212.

Thus, in one embodiment, after a graphical program has been created, a portion of the graphical program may be transferred and/or compiled for execution on the on-board processor 212 and executed locally on the interface card 134A via the processor 212 and memory 214, and a second portion of the graphical program may be translated or converted into a hardware executable format and downloaded to the FPGA 206 for hardware implementation.

As mentioned above, as one example, a first portion of a block diagram (that requires real time or fast execution) of a graphical program may be converted into a hardware executable format and downloaded to the FPGA 206 for hardware implementation, and a second portion of a block diagram (that may not require real time performance) may be stored in the memory 214 as program instructions and executed by the processor 212, in either a compiled or interpreted manner. As another example, a portion or all of the block diagram portion of the graphical program may be converted into a hardware executable format and downloaded to the FPGA 206 for hardware implementation, and a user interface portion (or front panel portion) of the graphical program may be stored in the memory 214 as program instructions and executed by the processor 212, in either a compiled or interpreted manner. Thus the portion of the graphical program which requires the most real time or deterministic (reliable and consistent) performance may be executed directly in hardware for fast operation, and other parts of the block diagram, or the user interface portion, which may not require real time performance, may execute on the processor 212. Where the processor executes the user interface portion, the processor may then send resulting signals to the video subsystem for display of the user interface on the computer display.

As shown, the interface card 134A may further include bus interface logic 216 and a control/data bus 218. In one embodiment, the interface card 134A is a PCI bus-compliant interface card adapted for coupling to the PCI bus of the host computer 102, or adapted for coupling to a PXI (PCI eXtensions for Instrumentation) bus. The bus interface logic 216 and the control/data bus 218 thus present a PCI or PXI interface.

The interface card 134A may also include local bus interface logic 208. In one embodiment, the local bus interface logic 208 may present a RTSI (Real Time System Integration) bus for routing timing and trigger signals between the interface card 134A and one or more other devices or cards, such as a motion device.

In one embodiment, the interface card 134A also includes a non-volatile memory 288 coupled to the programmable hardware element 206, the processor 212 and the memory 214. The non-volatile memory 288 may be operable to store the hardware description received from the host computer system to enable execution of the hardware description in the programmable hardware element 206 prior to or during booting of the computer system 102. The non-volatile memory 288 may also store software used by the processor, such as a RTOS and/or a graphical program execution engine.

Figure 5B:
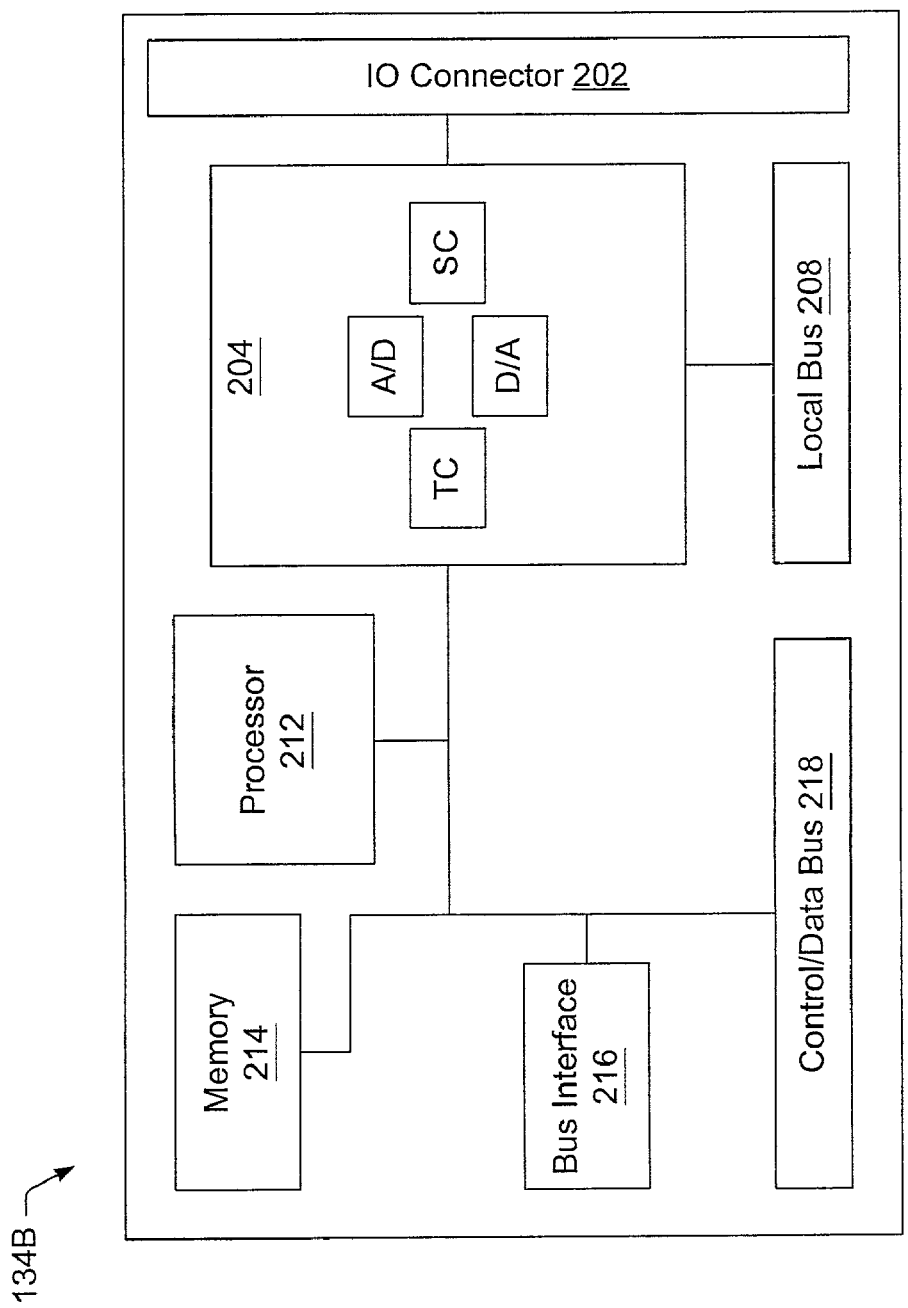

In the embodiment of FIG. 5B, the programmable hardware element 206 is not included on the interface card 134B, and thus the functional unit of the device 134B comprises only processor 212 and memory 214. Thus, in deploying the graphical program, a portion or all of the graphical program which is to be deployed may be transferred to the memory 214 for execution by the processor 212. The graphical program may be transferred in its native format to the memory 214 and executed by the processor 212 using a graphical program execution engine and possibly a RTOS. Alternatively, the graphical program may be compiled into an executable program (e.g., machine language, a script, or an interpretable data structure) and transferred to the memory 214 for execution by processor 212.

Figure 5C:
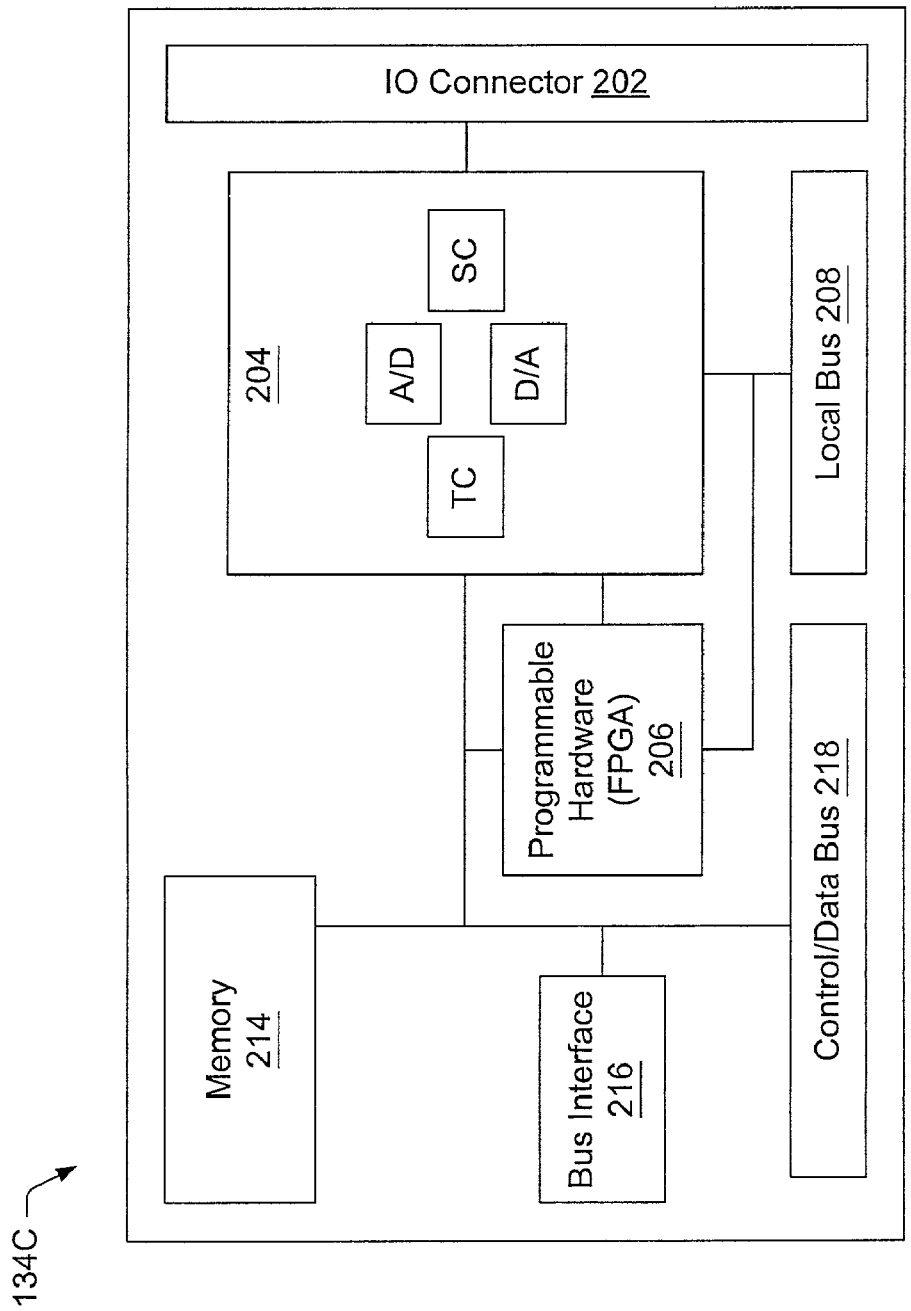

In the embodiment of FIG. 5C, the processor 212 is not included on the interface card 134C, i.e., the functional unit of the device 134C comprises the FPGA 206 and the memory 214. In this embodiment, the memory 214 may be used for storing FPGA state information. Thus in the embodiment of FIG. 5C, any supervisory control portion of the graphical program which is necessary or desired to execute on a programmable processor in software may be executed by the host CPU in the computer system 102, and is not executed locally by a processor on the interface card 134B.

Figure 6A:
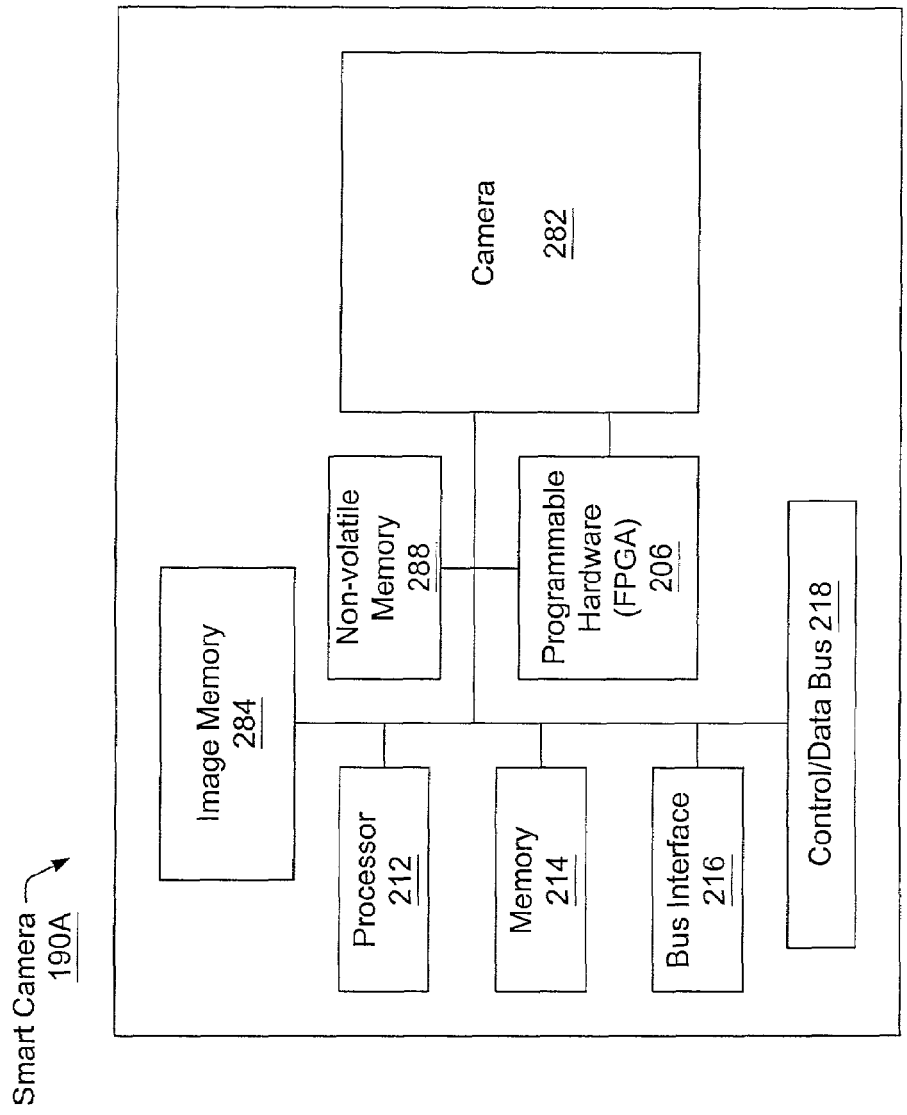
FIGS. 6A–6C are block diagrams illustrating a smart camera configured with a programmable hardware element and/or a processor and memory, according to various embodiments of the invention.
Figure 6B:
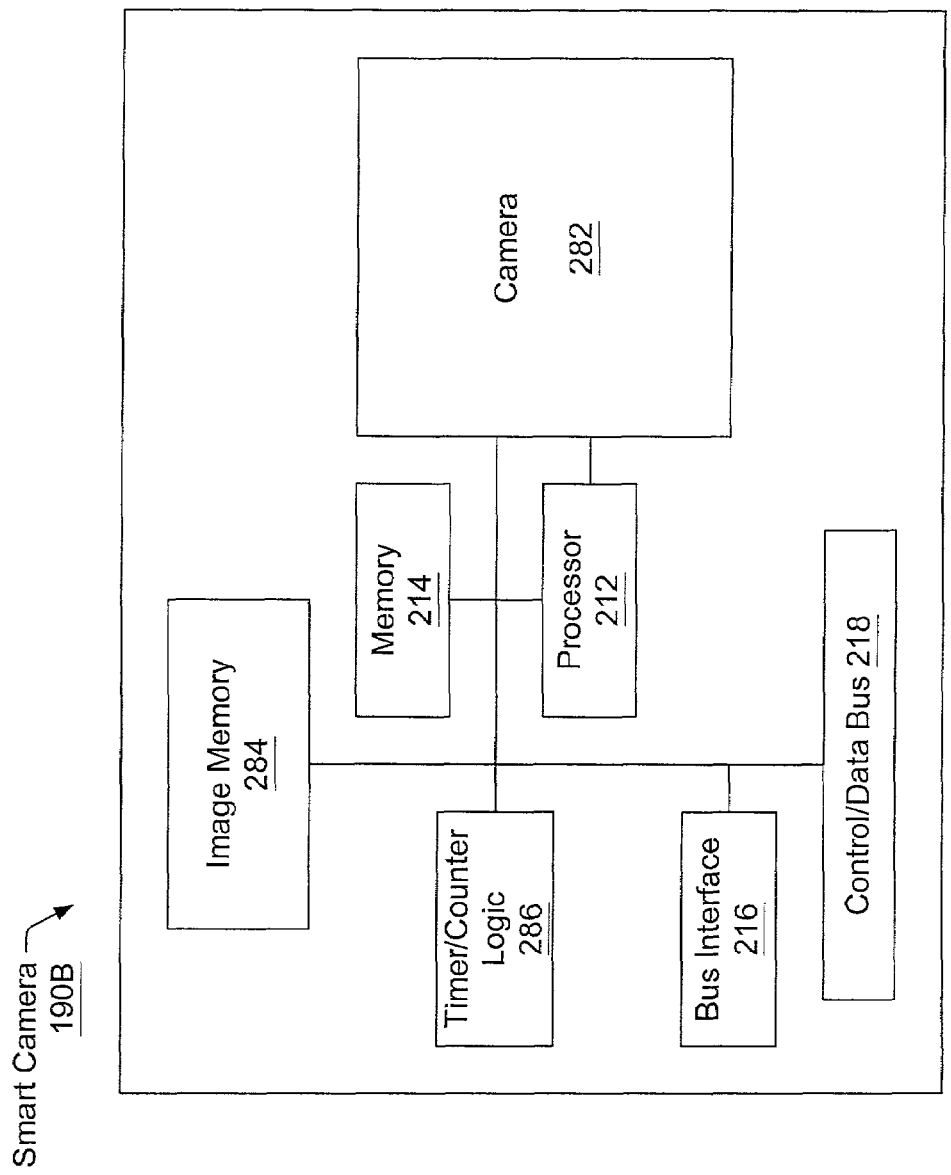
Figure 6C:
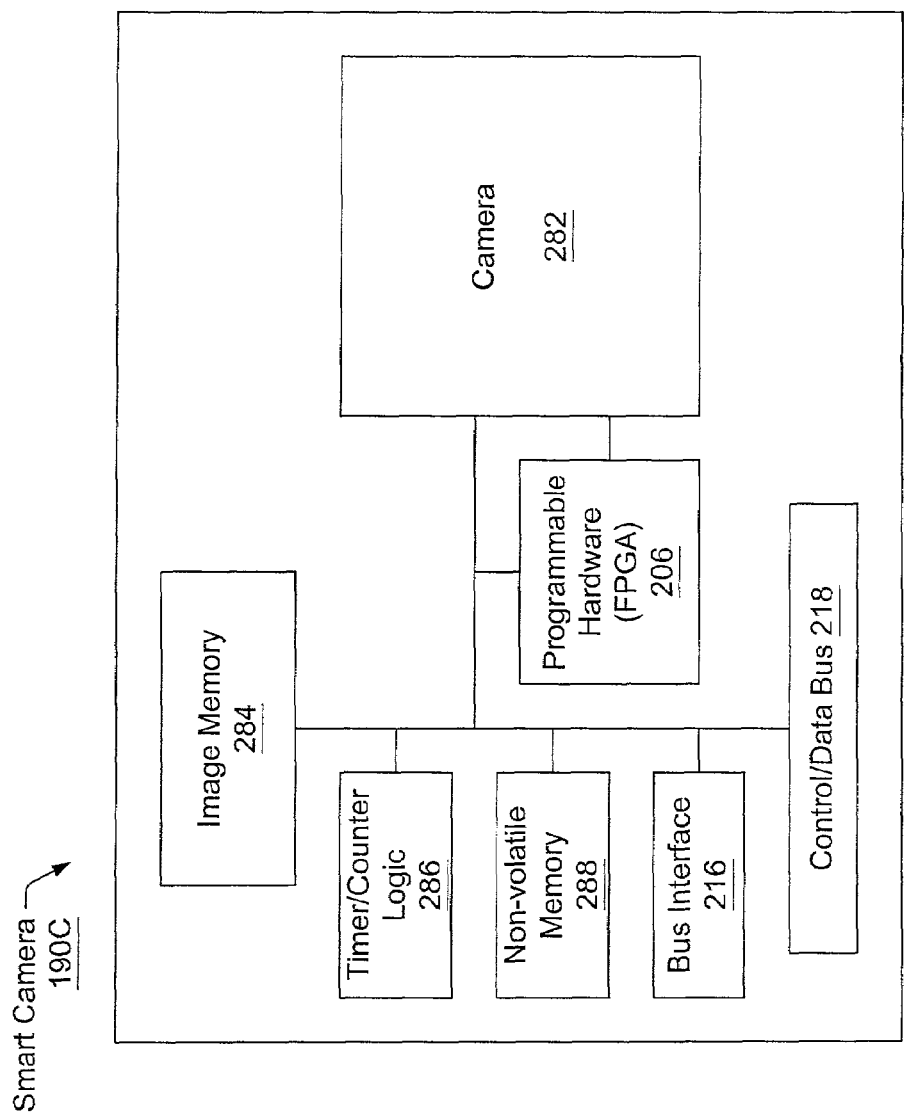

FIGS. 6A–6C—Block Diagrams of Smart Cameras with Programmable Hardware

FIGS. 6A–6C are block diagrams of various embodiments of a smart camera 190 with programmable hardware. As may be seen, the various embodiments share a number of features and configurations with the various interface cards 134 described above with reference to FIGS. 5A–5C, specifically the use of various combinations of processor/memory elements and programmable hardware, e.g., FPGAs, to execute portions of a graphical program. It should be noted that these embodiments are meant to be illustrative only, and are not intended to limit the architecture, components, or form of the smart camera 190.

FIG. 6A illustrates one embodiment of a smart camera 190 which includes a camera 282 and a functional unit. In this embodiment, the functional unit may comprise a programmable hardware element 206, e.g., a field programmable gate array (FPGA) such as those available from Xilinx, Altera, etc, and may also comprise a processor 212 and memory 214. Each of the programmable hardware element 206, processor 212 and memory 214 may be coupled to the camera 282 and/or to an image memory 284.

As shown, the smart camera 190A may also include a non-volatile memory 288 coupled to the programmable hardware element 206, the processor 212, the memory 214 and the image memory 284. The non-volatile memory 288 may be operable to store the hardware description and/or graphical program received from the host computer system to enable execution of the functional unit prior to or during booting of the computer system 102.

Although not shown, the smart camera 190 may include an I/O connector 202 which is operable to send and receive signals. The I/O connector 202 may present analog and/or digital connections for receiving/providing analog or digital signals. For example the I/O connector 202 may enable the smart camera to communicate with computer system 102 to receive a graphical program for performing image processing functions. Thus a graphical program can be created on the computer 102, or on another computer in a networked system, and at least a portion of the graphical program can be deployed onto a functional unit of the smart camera. The portion of the graphical program converted into a hardware implementation form is preferably a portion which requires fast and/or real-time execution.

As noted above, the smart camera 190A includes a dedicated on-board processor 212 and memory 214 in addition to the programmable hardware element 206. This enables a portion of the graphical program to be compiled into machine language for storage in the memory 214 and execution by the processor 212 (or to execute natively). This is in addition to a portion of the graphical program being converted into a hardware implementation form in the FPGA 206. Thus, in one embodiment, after a graphical program has been created, a portion of the graphical program may be compiled for execution on the on-board processor 212 and executed locally on the smart camera 190A via the processor 212 and memory 214, and a second portion of the graphical program may be translated or converted into a hardware executable format and uploaded to the FPGA 206 for hardware implementation.

For example, in a manner similar to that described above with reference to FIG. 5A, a first portion of a block diagram (that requires real time or fast execution) of a graphical program, e.g., a graphical image processing program, may be converted into a hardware executable format and downloaded to the FPGA 206 for hardware implementation, and a second portion of a block diagram (that may or may not require real time performance) may be stored in the memory 214 as program instructions and executed by the processor 212, in either a compiled or interpreted manner. As another example, a portion or all of the block diagram portion of the graphical program may be converted into a hardware executable format and downloaded to the FPGA 206 for hardware implementation, and a user interface portion (or front panel portion) of the graphical program may be downloaded and stored in the memory 214 as program instructions and executed by the processor 212, in either a compiled or interpreted manner. Thus the portion of the graphical program which requires the most real time or deterministic (reliable and consistent) performance may be executed directly in hardware for fast operation, and other parts of the block diagram, or the user interface portion, which may not require real time performance, may execute on the processor 212. Where the processor executes the user interface portion, the processor may then send resulting signals to a video subsystem (of, for example, the computer system 102) for display of the user interface on the computer display.

As noted above the smart camera 190A may include image memory 284 which couples to the programmable hardware 206, the camera 282, the processor 212, memory 214, bus interface 216, and the control/data bus 218. The image memory 284 may be operable to store a portion of an image, or one or more images received from the camera 282. The image memory 284 may enable the programmable hardware 206 and/or the processor 212 to retrieve the one or more images, operate on them, and return the modified images to the image memory. Additionally, the images may be retrievable for transmission to external systems, such as the computer system 102, via the I/O connector 202, for example.

As shown, the smart camera 190A may further include bus interface logic 216 and a control/data bus 218. In one embodiment, the smart camera 190A is a PCI bus-compliant interface card adapted for coupling to the PCI bus of the host computer 102, or adapted for coupling to a PXI (PCI eXtensions for Instrumentation) bus. The bus interface logic 216 and the control/data bus 218 thus present a PCI or PXI interface.

Although not shown, in one embodiment, the smart camera 190A may also include local bus interface logic 208, as shown in FIG. 5A. In one embodiment, the local bus interface logic 208 may present a RTSI (Real Time System Integration) bus for routing timing and trigger signals between the smart camera 190A and one or more other devices or cards, such as other smart camera, motion devices, or other smart sensors.

In yet another embodiment, the smart camera 190A may include data acquisition (DAQ) logic 204, not shown, such as analog to digital (A/D) converters, digital to analog (D/A) converters, timer counters (TC) and signal conditioning (SC) logic, as shown in FIG. 5A. The DAQ logic 204 may be useful for signal processing and motion control applications. The programmable hardware element or FPGA 206 may access these resources directly, thereby enabling creation of very powerful measurement, DSP and control applications, among others. For example, if the camera 282 is an analog camera, the smart camera 190A may further include analog to digital (A/D) logic (not shown) for converting analog image signals into a digital image for storage in the memory.

FIG. 6B illustrates another embodiment of a smart camera 190B, with a configuration similar to that of interface card 134B, described above with reference to FIG. 5B. As FIG. 6B shows, in this embodiment, the smart camera 190B includes the camera 282, processor 212, memory 214, image memory 284, control/data bus 218, and bus interface 216 described above with reference to FIG. 6A, but does not include the programmable hardware (e.g., FPGA). Thus, in this embodiment the functional unit comprises only the processor 212 and memory 214. Thus a portion or all of a graphical program may be deployed to the processor/memory component 212/214. As FIG. 6B also shows, timer/counter logic 286 may also be included on the smart camera. The timer/counter logic 286 may be coupled to the other components of the smart camera 190B, and may be operable to provide high-performance timing and counting functions to the various elements of the smart camera 190B. For example, in one embodiment, the timer/counter logic may be used by the processor 212 to accurately control image acquisition by the camera 282, such as for a high speed assembly line, or for capturing images of a fast-moving object.

FIG. 6C illustrates another embodiment of a smart camera 190C, where the smart camera 190C includes programmable hardware 206 and non-volatile memory 288, but does not include the processor 212 and memory 214. Thus in the embodiment of FIG. 6C the functional unit comprises only the FPGA 206. Thus, any supervisory control portion of the graphical program which is necessary or desired to execute on a programmable processor in software may be executed by the host CPU in the computer system 102, and is not executed locally by processor 212, i.e., on the smart camera 190C. As FIG. 6C also shows, the smart camera may include camera 282, bus interface 216, control/data bus 218, image memory 284, and timer/counter logic 286, as described above. Thus, a graphical image processing program, in the form of a hardware description, may be converted into a hardware executable format and downloaded to the programmable hardware element 206 for hardware implementation. Note that, as described above, the non-volatile memory 288 (or a separate volatile memory not shown) may be operable to store the hardware description received from the host computer system 102 to enable execution of the hardware description in the programmable hardware element 206 prior to or during booting of the computer system 102.

Figure 7:
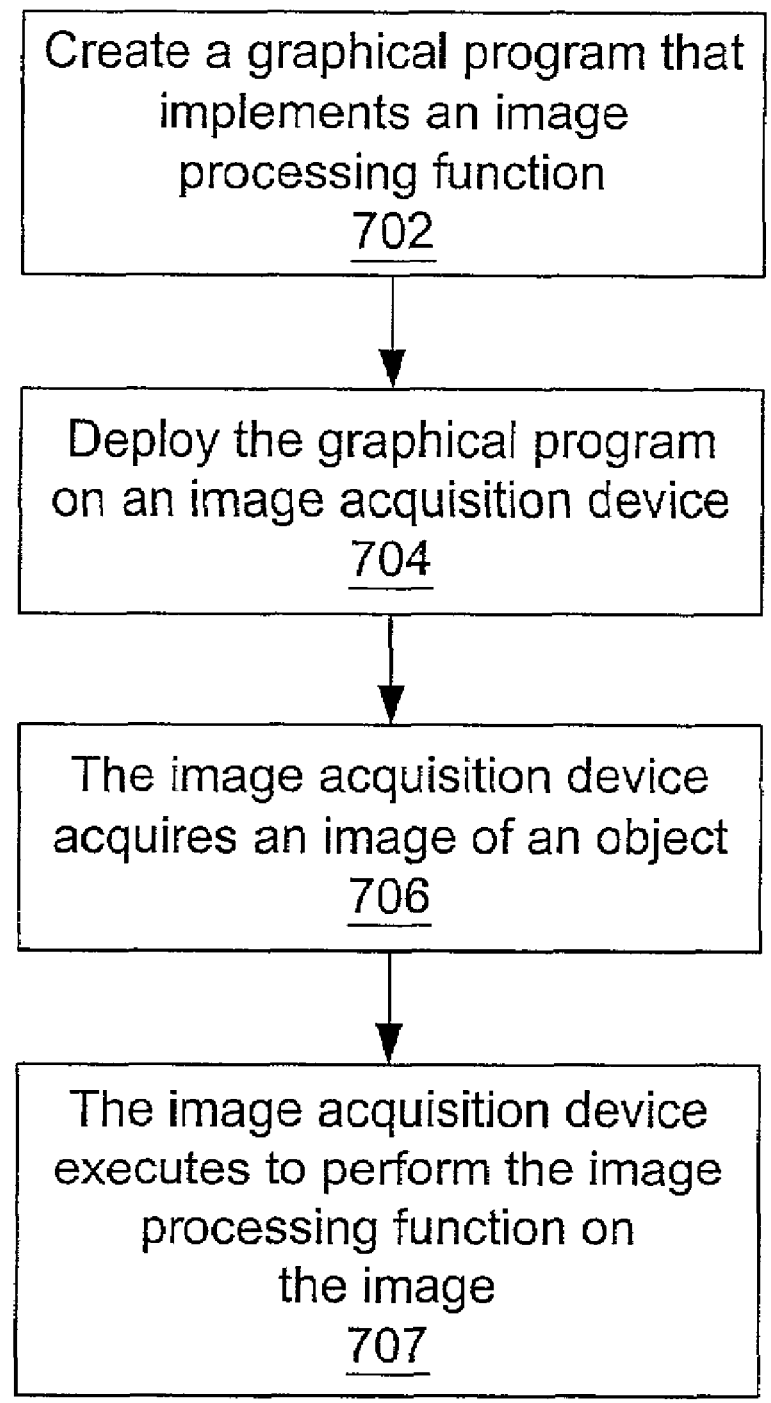
FIG. 7 is a flowchart diagram illustrating deployment of a graphical program on a device, according to one embodiment of the invention.

FIG. 7—Method for Deploying a Graphical Program on an Image Acquisition Device

FIG. 7 illustrates one embodiment of a method for deploying a graphical program on an image acquisition device to perform an image processing function, where the image acquisition device includes a functional unit. Said another way, a computer-implemented method is presented for configuring an image acquisition device to perform an image processing function using a graphical program. Note that the method shown in FIG. 7 may be used to configure any of the instruments or devices shown in FIGS. 1–6D. It should be noted that in various embodiments, various steps in the method may occur concurrently, or in a different order than shown. Additionally, some steps may be omitted, or additional steps performed which are not shown, as desired. As shown, this method may operate as follows.

In step 702 a graphical program may be created that implements an image processing function. In the preferred embodiment, the graphical program is created on the computer system 102, although in other embodiments the graphical program may be created on a different computer system, for example, coupled to computer system 102 over a network. The graphical program may be created or assembled by the user with a graphical programming environment, such as the LabVEW graphical programming development environment. In an alternate embodiment, the graphical program may be created in step 702 by the user specifying one or more functions or tasks, after which the specification may be analyzed and the graphical program generated automatically or programmatically from the specification. For example, the user may use a prototyping environment to create a script or prototype representing an image processing algorithm, and then a graphical program may be manually or programmatically created based on this prototype. It is noted that other approaches may also be used to create the graphical program, either manually by the user, or programmatically by software.

In step 704 the graphical program may be deployed on the image acquisition device 134. Note that in the preferred embodiment, the image acquisition device 134 is coupled to the computer system 102 to facilitate the deployment of the graphical program. In one embodiment, the image acquisition device 134 may be comprised in the computer system 102. In other embodiments the image acquisition device 134 may be coupled to the computer system 102 through a network, such as the Internet, or may be coupled to the computer system 102 through wireless means. In another embodiment, a human user may manually retrieve the graphical program from the computer 102 and load the graphical program onto the image acquisition device 134. As described in more detail below, deploying the graphical program on the image acquisition device 134 may comprise storing the graphical program on (at least part of) the functional unit, or configuring the functional unit with all or part of the graphical program, such that after the deployment, the functional unit is operable to execute or implement the functionality of the graphical program.

In step 706, the image acquisition device 134 may acquire an image of an object, such as, for example, the UUT 150, or an element or state of a system or process. In the preferred embodiment, the image is acquired via camera 132, although in other embodiments the image may be acquired from an external system, such as a computer or another image acquisition device. In one embodiment, the image acquisition device 134 may receive an image present signal, and acquire the image of the object in response to receiving the image present signal. In one embodiment, the image acquisition device may be coupled to a camera, and the image acquisition device acquiring an image of the object may comprise the camera acquiring the image of the object and the image acquisition device receiving and storing the image.

Finally, in step 708, the image acquisition device may execute to perform the image processing function on the acquired image from 706. In other words, the functional unit on the image acquisition device 134 may execute all or part of the graphical program. For example, the image processing function may operate to analyze the image and detect, recognize, or characterize one or more features or characteristics of the object, such as position, orientation, color, or possible flaws or lack thereof, among others. In one embodiment, the image acquisition device may perform a control operation after executing to perform the image processing function on the image. In another embodiment, the image acquisition device may generate a pass/fail indication after executing to perform the image processing function on the image. In another embodiment, the image acquisition device executing to perform the image processing function on the acquired image may comprise the image acquisition device determining characteristics of the image after performing the image processing function, and the image acquisition device 134 performing an operation based on the determined characteristics of the image.

For example, in a quality control system in an automated assembly plant, in performing the image processing function on the acquired image, the image acquisition device may determine a characteristic of the image indicating that the imaged object is defective. The image acquisition device 134 may then send a signal, such as a pass/fail indication, to a motion control device which may remove the defective object from the assembly line. An example of such a system is described above with reference to FIGS. 3A and 3B.

In one embodiment, the image acquisition device 134 may include processor 212 and memory 214, as described above with reference to FIGS. 5B and 6B. The deployment of the graphical program on the image acquisition device 134 described in 704 may then comprise transferring the graphical program to the memory 214 on the image acquisition device 134.

In one embodiment, deploying the graphical program on the image acquisition device 134 may include generating an executable program (a machine language program) based on the graphical program, which implements the functionality of the graphical program, and transferring the executable program to the memory 214 on the image acquisition device. In this embodiment, the image acquisition device executing to perform the image processing function on the image in 708 may comprise the processor 212 in the image acquisition device 134 executing the executable program from the memory 214, possibly by executing a real time operating system (RTOS) from the memory 214. In the case where the executable program is generated from the graphical program, the image acquisition device executing to perform the image processing function on the image may comprise the processor in the image acquisition device executing the executable program (in executable form) from the memory 214.

In another embodiment, deploying the graphical program on the image acquisition device 134 may include transferring the graphical program in its native or original format to the memory 214 on the image acquisition device. In this embodiment, the image acquisition device executing to perform the image processing function on the image in 708 may comprise the processor 212 in the image acquisition device 134 executing a graphical program execution engine, and possibly a real time operating system (RTOS) from the memory 214.

In another embodiment, the image acquisition device may include a programmable hardware element 206, such as an FPGA, as described above with reference to FIGS. 5C and 6C. The deployment of the graphical program on the image acquisition device 134 described in 704 may then comprise generating a hardware description based on the graphical program, which describes a hardware implementation of the graphical program, and configuring the programmable hardware element 206 in the image acquisition device 134 utilizing the hardware description. Configuring the programmable hardware element 206 in the image acquisition device 134 utilizing the hardware description may comprise converting the hardware description, such as a VHDL file, into a netlist using available synthesis tools, and the compiling the netlist into a hardware program file (also called a software bit stream), which may be used to configure or program the programmable hardware element 206.

After configuring the programmable hardware element 206 with the hardware description, the programmable hardware 206 implements a hardware implementation of the graphical program. In this embodiment, the image acquisition device executing to perform the image processing function on the image in 708 may comprise the programmable hardware element 206 in the image acquisition device executing to perform the image processing function on the image.

In yet another embodiment, the image acquisition device may include the processor 212 and memory 214 and the programmable hardware element 206, as described above with reference to FIGS. 5A, 6A, and 6D. The deployment of the graphical program on the image acquisition device 134 described in 704 may then comprise transferring a first portion of the graphical program to the memory 214 on the image acquisition device 134 (either in native or compiled form), generating a hardware description based on a second portion of the graphical program describing a hardware implementation of the graphical program, and configuring the programmable hardware element in the image acquisition device utilizing the hardware description, after which the programmable hardware element implements a hardware implementation of the second portion of the graphical program. This embodiment of the invention may be referred to as a "dual mode" embodiment. In this embodiment, the image acquisition device executing to perform the image processing function on the image in 708 may comprise the processor 212 in the image acquisition device 134 executing the first portion of the graphical program from the memory 214 and the programmable hardware element 206 executing the second portion of the graphical program.

In an exemplary dual mode embodiment, the deployment may include generating an executable program based on the first portion of the graphical program, which implements the functionality of the first portion of the graphical program, and transferring the executable program to the memory 214 on the image acquisition device. The second portion may be configured on the programmable hardware element.

In one embodiment, the first portion of the graphical program may comprise an image processing portion, and the second portion of the graphical program may comprise a control portion. In another embodiment, the first portion of the graphical program may comprise a control portion, and the second portion of the graphical program may comprise an image processing portion. In this embodiment, the image acquisition device executing to perform the image processing function on the image in 708 may comprise the processor 212 in the image acquisition device 134 executing the executable program from the memory 214 to implement the first portion and the programmable hardware element 206 executing the second portion of the graphical program.

In yet another embodiment of the present invention, the image acquisition device 134 may include a first processor 212A, a second processor 212B, and at least one memory 214. In this case, the image acquisition device executing to perform the image processing function on the image may comprise the first processor 212A in the image acquisition device 134 executing a first portion of the graphical program from the at least one memory 214 and the second processor 212B in the image acquisition device 134 executing a second portion of the graphical program from the at least one memory 214. Note that in this case, both the first portion and the second portion of the graphical program are executable by a processor from memory. For example, the first portion of the graphical program may comprise an image processing portion, and the second portion of the graphical program may comprise a control portion. In another embodiment, the first portion of the graphical program may comprise a first portion of the image processing function, and the second portion of the graphical program may comprise a second portion of the image processing function. Alternatively, the functional unit may comprise two or more programmable hardware elements which operate as above.

In one embodiment, the image acquisition device may comprise a smart camera, such as described above with reference to FIG. 2B, and FIGS. 6A–C. In another embodiment, the image acquisition device may comprise an image acquisition board coupled to or comprised in a computer system, as shown in FIG. 2A, and FIGS. 5A–C.

More detailed embodiments of this method are presented below with reference to FIGS. 8A and 8B.

Figure 8A:
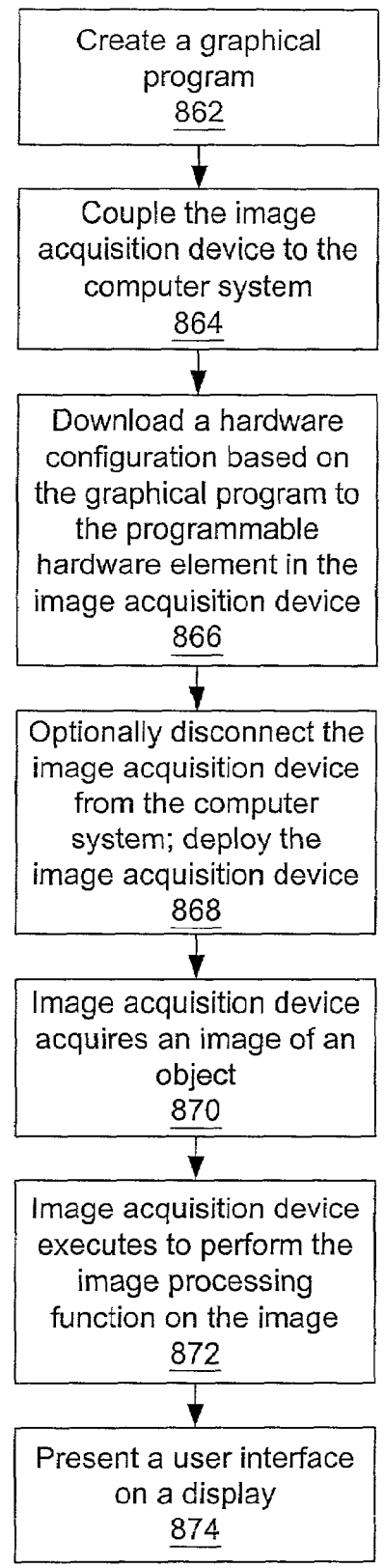
FIG. 8A is a flowchart illustrating configuration of an image acquisition device or smart camera including a programmable hardware element, according to one embodiment of the invention.

FIG. 8A—Configuring an Image Acquisition Device or Smart Camera Including Programmable Hardware to Perform an Image Processing Function FIG. 8A is an exemplary embodiment illustrating a method for configuring an image acquisition device 134, such as smart camera 190, with a graphical program to perform an image processing function, where the image acquisition device 134 (or smart camera 190) includes a functional unit, more specifically, a programmable hardware element 206. The method shown in FIG. 8A is a more detailed version of the method of FIG. 7 described above, wherein the method is described with reference to an image acquisition device or smart camera. It should be noted that in various embodiments, various steps in the method may occur concurrently, or in a different order than shown. Additionally, some steps may be omitted, or additional steps performed which are not shown, as desired. As shown, this method may operate as follows.

First, in step 862 a graphical program may be created on the computer system 102 (or on a different computer system). The graphical program may be created or assembled by the user arranging on a display a plurality of nodes or icons and then interconnecting the nodes to create the graphical program. In response to the user assembling the graphical program, data structures (and/or program instructions) may be created and stored which represent the graphical program. The nodes may be interconnected in one or more of a data flow, control flow, or execution flow format. The graphical program may thus comprise a plurality of interconnected nodes or icons which visually indicates the functionality of the program. As noted above, the graphical program may comprise a block diagram and may also include a user interface portion or front panel portion. Where the graphical program includes a user interface portion, the user may assemble the user interface on the display. As one example, the user may use the LabVIEW graphical programming development environment to create the graphical program.

In an alternate embodiment, the graphical program may be created in step 862 by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", incorporated by reference above. The graphical program may be created in other manners, either by the user or programmatically, as desired. In the present example where the instrument is an image acquisition device 134 (e.g., smart camera 190), the graphical program may implement an image processing function.

In step 864 the image acquisition device 134 (e.g., smart camera 190) may be coupled to the computer system 102. The image acquisition device 134 (e.g., smart camera 190) may be coupled to the computer system 102 over a network, via communication cable(s), through wireless means, or by any other method of coupling, as desired. As noted above, the smart camera 190 may comprise a camera and a programmable hardware element 206. It is noted that the image acquisition device may be connected to the computer system 102 before, during or after the graphical program is created.

In step 866 a hardware configuration based on the graphical program may be downloaded onto the programmable hardware element 206 in the image acquisition device 134 (e.g., smart camera 190) to configure the programmable hardware element 206. For example, in the embodiment where the image acquisition device 134 is coupled to the computer system 102 over a network, deploying the graphical program may comprise the computer system 102 deploying the graphical program over the network to the image acquisition device 134. The hardware configuration corresponds to a hardware implementation of the graphical program. In one embodiment, downloading the hardware configuration onto the programmable hardware element 206 may comprise the following steps: generating a hardware description based on the graphical program, where the hardware description describes a hardware implementation of the graphical program; converting the hardware description into a netlist; compiling the netlist format into a hardware program file; and downloading the hardware program file to the programmable hardware element to configure the programmable hardware element. These steps are discussed below.

After the downloading step is performed, the programmable hardware element is configured with a hardware implementation of the graphical program. At this point, in step 868 the image acquisition device (e.g., smart camera 190) may be optionally disconnected from the computer system 102, and may possibly be deployed for operation. For example, in the case of smart camera 190, the smart camera 190 may be disconnected from the computer system 102 and deployed in a vision application, such as a manufacturing vision inspection application, a manufacturing assembly application, or other vision application. If the image acquisition device is an image acquisition card or board that is designed to be located in a slot of the computer 102, the image acquisition card or board 134 may optionally remain in the computer system 102 for use, or may be transferred to a different computer system. Alternatively, the method described above may be repetitively used to manufacture a plurality of image acquisition devices 134 (e.g., smart camera 190) for later sale. As another alternative, the method described above may be used to configure an image acquisition device 134 that has already been deployed, where the image acquisition device 134 is configured over a network, i.e., where the hardware configuration is downloaded onto the image acquisition device 134 (or other instrument) over a network.

After the programmable hardware element 206 in the image acquisition device 134 (e.g., smart camera 190) is configured with a hardware implementation of the graphical program, the image acquisition device 134 can be used in an application. Thus the image acquisition device 134 or smart camera 190 may acquire an image of an object in step 870, e.g., from a camera 132, or the camera in smart camera 190 may acquire the image. The programmable hardware element 206 in the image acquisition device 134 may then execute in step 872 to perform the image processing function on the image.

While the programmable hardware element 206 in the image acquisition device 134 executes to perform the image processing function on the image, if the graphical program includes a user interface portion, this user interface portion may optionally be presented on a display during this time in step 874. The code corresponding to the user interface portion may be executed by a processor 160 in the computer system 102 or by a processor 212 on the image acquisition device 134. The user interface portion may operate as a front panel for the image acquisition device 134. The user may optionally provide user input to the user interface portion on the display to control the image acquisition device 134 while the programmable hardware element 206 in the image acquisition device 134 executes to perform the image processing function on the image. For example, the user interface portion may be compiled into executable code for execution by a processor (160 or 212) and stored in a memory (166 or 214) accessible by the processor. The processor may then execute the executable code (the user interface portion) from the memory to present the user interface portion on the display.

In an embodiment where the image acquisition device 134 (or smart camera 190) includes the processor 212 and the memory 214, the processor 212 in the image acquisition device may execute the executable code from the memory 214 to present the user interface portion on the display during the image acquisition device 134 (or smart camera 190) executing to perform the image processing function on the image.

In another embodiment, the processor 160 of the computer system 102 may execute the executable code from the memory 166 to present the user interface portion on the display during the image acquisition device 134 (or smart camera 190) executing to perform the image processing function on the image.

Figure 8B:
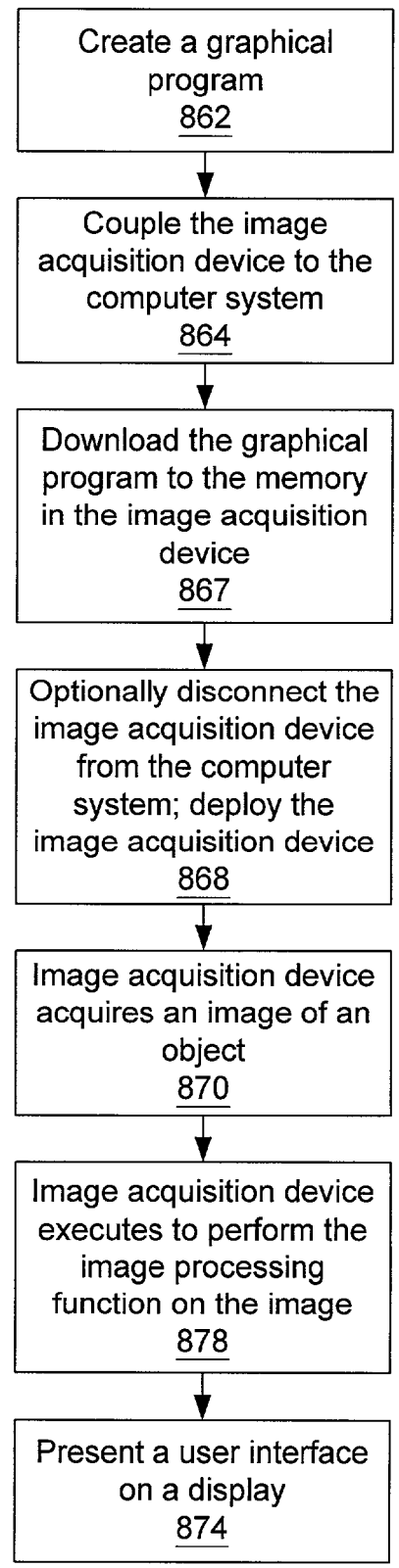
FIG. 8B is a flowchart illustrating configuration of an image acquisition device or smart camera including a processor and memory, according to one embodiment of the invention.

FIG. 8B—Configuring an Image Acquisition Device or Smart Camera to Perform an Image Processing Function FIG. 8B is an exemplary embodiment illustrating a method for configuring an image acquisition device 134, such as smart camera 190, with a graphical program to perform an image processing function, where the image acquisition device 134 (or smart camera 190) includes a functional unit, more specifically, a processor 212 and memory 214. The method shown in FIG. 8B is another, more detailed version of the method of FIG. 7 described above, and is similar to the method described above with reference to FIG. 8A, differing from that method only in steps 866 and 872. Thus, in describing this embodiment of the method, where the steps are the same as described above, an abbreviated description is provided. As noted above, in various embodiments, various steps in the method may occur concurrently, or in a different order than shown. Additionally, some steps may be omitted, or additional steps performed which are not shown, as desired. As shown, this method may operate as follows.

First, in step 862 a graphical program may be created on the computer system 102 (or on a different computer system), as described above with reference to FIG. 8A, step 862.

In step 864 the image acquisition device 134 (e.g., smart camera 190) may be coupled to the computer system 102, such as over a network, communication cable(s), through wireless means, or by any other method of coupling, as described above with reference to FIG. 8A, step 864.

In step 867 the graphical program may be downloaded to the memory 214 of the image acquisition device 134 (e.g., smart camera 190). As mentioned above, downloading the graphical program onto the memory 214 may comprise the following steps: generating an executable program (an executable program) based on the graphical program which implements the functionality of the graphical program; and transferring the executable program to the memory 214 on the image acquisition device. As also mentioned above, downloading the graphical program onto the memory 214 may comprise downloading the graphical program (or executable program) onto the memory 214 over a network.

After the downloading step is performed, the image acquisition device 134 is configured to perform the image processing function implemented by the graphical program. At this point, in step 868 the image acquisition device 134 (e.g., smart camera 190) may be optionally disconnected from the computer system 102, and may possibly be deployed for operation, as described above in step 868 of FIG. 8A.

After the image acquisition device 134 (e.g., smart camera 190) is configured with the graphical program, i.e., after the graphical program is loaded into the memory 214, the image acquisition device 134 can be used in an application. Thus the image acquisition device 134 or smart camera 190 may acquire an image of an object in step 870, e.g., from a camera 132, or the camera in smart camera 190 may acquire the image. The image acquisition device 134 may then execute to perform the image processing function on the image, as indicated in step 873.

While the image acquisition device executes to perform the image processing function on the image, if the graphical program includes a user interface portion, this user interface portion may optionally be presented on a display during this time in step 874, as described above in step 874 of FIG. 8A.

In one embodiment, the user may optionally provide user input to the user interface portion on the display to control the image acquisition device while the image acquisition device 134 (i.e., the processor 212 and memory 214) executes to perform the image processing function on the image.

In one embodiment, the image acquisition device executing to perform the image processing function on the image in 708 may comprise the processor 212 in the image acquisition device 134 executing the graphical program from the memory 214. In the embodiment where the executable program is generated from the graphical program, the image acquisition device executing to perform the image processing function on the image may comprise the processor in the image acquisition device executing the executable program (in executable form) from the memory 214.

In one embodiment, the processor 212 in the image acquisition device may execute the executable code from the memory 214 to present the user interface portion on the display during the image acquisition device 134 (or smart camera 190) executing to perform the image processing function on the image. In other words, the processor 212 may execute both portions of the graphical program concurrently, such as by threading or multi-tasking. In another embodiment, the image acquisition device 134 (or smart camera 190) may include multiple processors, e.g., 212A and 212B, in which case the first portion of the graphical program (such as the user interface portion) may be executed by processor 212A from memory 214 (or a first memory 214A), while the second portion (such as the image processing portion) may be executed by processor 212B from memory 214 (or a second memory 214B), or from image memory 284.

In one embodiment, the graphical program which implements the image processing function may already have been created, for example, by a third party. The method may then comprise coupling the image acquisition device 134 to a computer system 102 which stores the graphical program, where the image acquisition device comprises a functional unit; and deploying the graphical program onto the functional unit in the image acquisition device 134 to configure the functional unit; where after the deploying, the functional unit is operable to implement the graphical program. In other words, step 862, and possibly steps 868 forward, may be omitted from the methods shown in FIGS. 8A and 8B.

Figure 9:
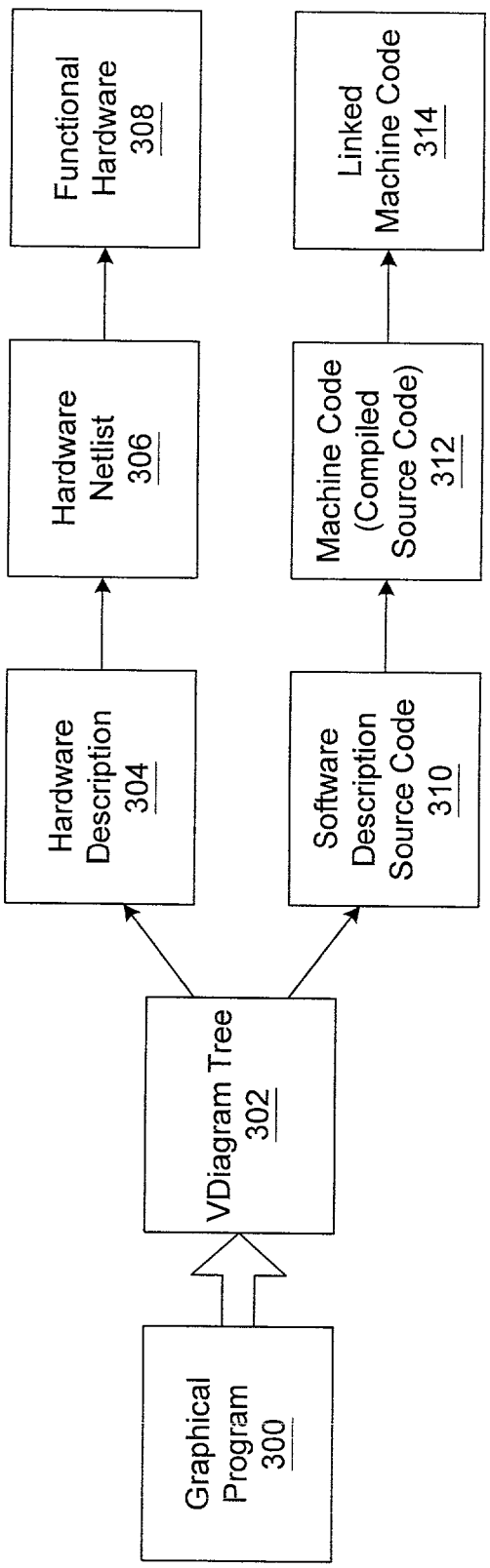
FIG. 9 illustrates the conversion of a graphical program to hardware and software implementations.

FIG. 9—Block Diagram of Conversion of a Graphical Program into Hardware and Software Descriptions FIG. 9 is a block diagram illustrating the conversion of a graphical program, such as a graphical image processing or machine vision program, into hardware and software descriptions. The graphical program 300 may comprise graphical code, such as interconnected function nodes or icons. The graphical code in the graphical program may use graphical data flow, graphical control flow and/or graphical execution flow constructs, as noted above. On the display, the graphical program may be represented as interconnected icons or function nodes. In the memory of the computer system, the graphical program 300 may comprise data structures (or scripts or code) representing functional operations, data flow and/or control flow, and execution order. As the user assembles the graphical program on the display, e.g., by selecting, arranging, and connecting various icons or function nodes on the display, the data structures (or scripts or code) may be automatically created and stored in memory.

The graphical program 300 may be created with various development tools. For example, the graphical program may be created using the following development systems: LabVIEW, BridgeVIEW, DASYLab, Visual Designer, HP VEE (Visual Engineering Environment), Snap-Master, GFS DiaDem, ObjectBench, Simulink, WiT, Vision Program Manager, Hypersignal, VisiDAQ, VisSim, Truly Visual, and Khoros, among others. In the preferred embodiment, graphical program 300 is a LabVIEW graphical program or virtual instrument (VI).

In one embodiment, programs of the present invention may create a VDiagram tree 302 from the data structures of the graphical program 300. The VDiagram tree 302 is an abstract hardware graph which represents at least a portion of the graphical program 300. The graph may be organized in a way that facilitates the generation of specific types of descriptions by back end programs of the present invention. In one embodiment, the graphical programming system automatically creates and stores a VDiagram tree 302 (abstract hardware graph) in response to a user's creation of a graphical program. In this instance, conversion from graphical program data structures to a VDiagram tree is not necessary.

A hardware description 304 may be generated from the abstract hardware graph 302 by a back end program. The hardware description 304 may be in any of various hardware description languages such as VHDL, EDIF, and Verilog. In the preferred embodiment, the hardware description 304 comprises one or more VHDL files. A hardware netlist 306 may be generated from the hardware description using various synthesis tools. As noted above, the term "netlist" comprises various intermediate hardware-specific description formats comprising information regarding the particular hardware elements required to implement a hardware design and the relationship among those elements. In the preferred embodiment, the hardware netlist 306 is an FPGA-specific netlist. The hardware netlist 306 is used to create or configure one or more functional hardware devices or hardware elements 308 which are configured to execute the portion of the graphical program 300 that is represented by the abstract hardware graph 302.

Hardware element 308 may comprise any of various devices. For example, hardware 308 may comprise a programmable logic device (PLD) such as an FPGA or CPLD. However, hardware 308 may comprise other types of hardware devices, such as a traditional circuit board which is created using the hardware netlist 306. In the preferred embodiment, hardware 308 is an interface card comprising an FPGA, where the interface card is comprised in the computer system where the graphical program 300 is created. The hardware 308 may also be comprised in an external device connected to the computer system where the graphical program 300 is created. The hardware 308 may be connected to the computer over an external serial or parallel bus, or over a network, such as the Internet.

As shown in FIG. 9, software description source code 310 may also be generated from the abstract hardware graph 302 by a back end program. The source code 310 may be in various source code languages such as C, C++, Java, etc. Machine code 312 may be produced from the source code 310 using various source code compilers. Linked machine code 314 may be produced from the machine code 312 using various machine code linkers. The linked machine code 314 is executable to perform the operations of the portion of the graphical program 300 that is represented by the abstract hardware graph 302.

Figure 10:
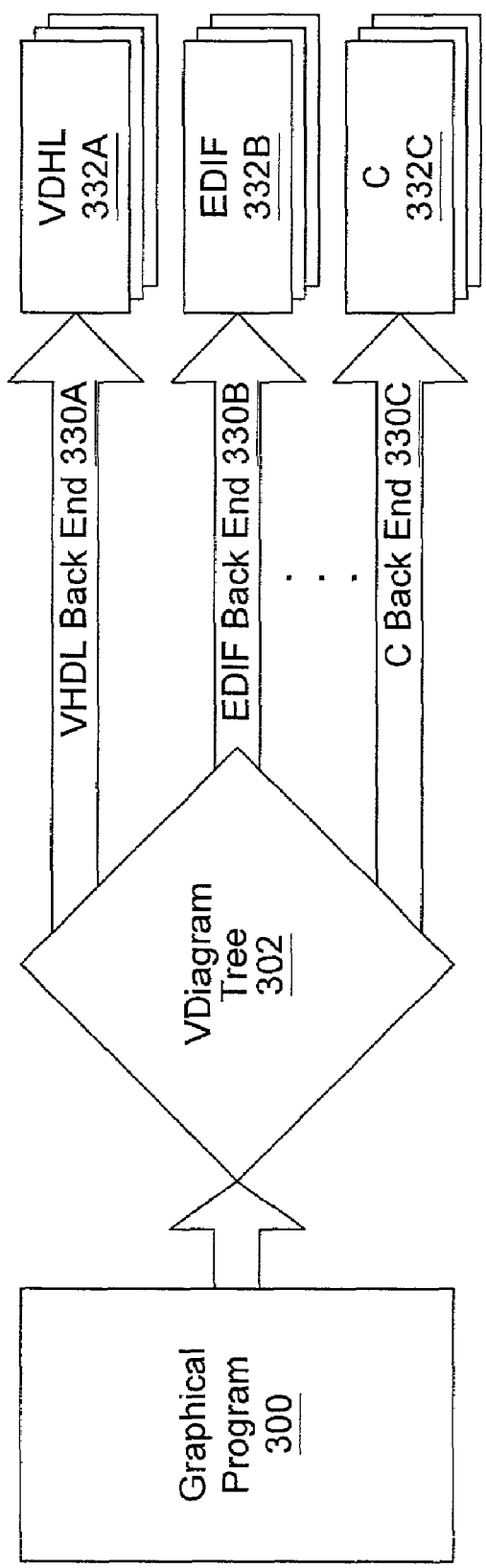
FIG. 10 illustrates the generation of various types of hardware and software descriptions from a VDiagram tree.

FIG. 10—Block Diagram of Generation of Hardware and Software Descriptions from a Vdiagram Tree FIG. 10 is a block diagram illustrating the generation of various types of hardware and software descriptions from a VDiagram tree. As described for FIG. 9, programs of the present invention create a VDiagram tree 302 from a graphical program 300. The VDiagram tree 302 represents at least a portion of the graphical program 300. Back end programs 330 generate hardware descriptions from the VDiagram tree 302. Exemplary back end programs 330A, 330B, and 330C are illustrated. Back end 330A generates a VHDL hardware description comprising one or more VHDL files. Back end 330B generates an EDIF hardware description comprising one or more EDIF files. Back end 330C generates a C source code software description comprising one or more C files. It is also contemplated that other back ends may be used to generate hardware descriptions in other hardware and/or software programming languages.

The number and type of back end programs that may be present are not limited. In the preferred embodiment, one or more back end programs may be called automatically as part of a process initiated by a user to generate hardware/software descriptions for the graphical program 300. In another embodiment, the VDiagram tree 302 may be generated and saved to a file, and the user may call a back end program at a later time to generate a hardware/software description.

As described above for FIG. 9, appropriate synthesis tools or compilers may be called to convert a hardware/software description into another format such as an FPGA-specific netlist or compiled machine code.

Figure 11:
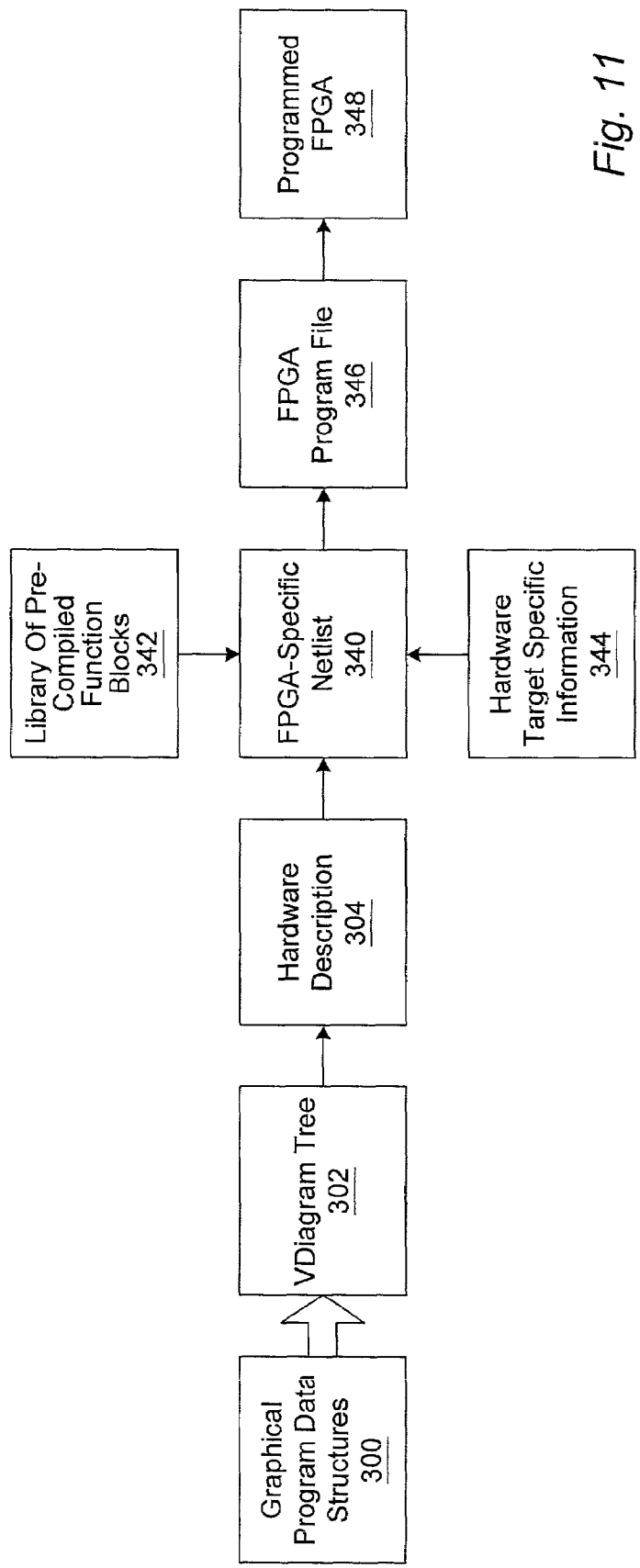
FIG. 11 illustrates the conversion of a graphical program into a hardware description and the use of the hardware description to program an FPGA.

FIG. 11—Block Diagram of Conversion of a Graphical Program into a Hardware Description for an FPGA FIG. 11 illustrates the exportation of at least a portion of a graphical program 300 into a hardware description and the use of the hardware description to program an FPGA. As described above for FIG. 10, the VDiagram tree 302 comprises information representing the graphical program 300, including the functional operations of the program. As described in detail below, the VDiagram tree comprises VDiagrams, each of which maintains a list of components. This list of components includes components which represent functional operations.

A back end program converts the VDiagram tree 302 to a hardware description 304. Back end programs may implement the functionality of the components in the VDiagram component lists using constructs of their respective description languages. For example, a VHDL back end may create VHDL code to implement a component that performs a particular mathematical algorithm such as an exponential calculation. However, in one embodiment, such functional components are simply referenced as library components.

FIG. 11 illustrates one embodiment in which the VDiagram tree references one or more library components. One embodiment of the present invention comprises pre-compiled function blocks 342 which implement these library components for particular hardware devices such as FPGAs. Various FPGA netlist synthesis tools may be called to generate an FPGA netlist 340 from the hardware description 304. These synthesis tools may incorporate the pre-compiled function blocks 342 into the FPGA netlist 340. Also, as shown, the synthesis tools may utilize hardware target-specific information in creating the netlist. For example, the exact form that the FPGA netlist takes may depend on the particular type of FPGA that will use the netlist, since FPGAs differ in their available resources.

An FPGA bit stream program file 346 may be generated from the FPGA netlist 340 using readily available synthesis tools. This FPGA program file may be uploaded to an FPGA 348. The FPGA 348 may be comprised in a hardware device such as an interface board. After being programmed with the program file 346, the FPGA is able to execute the portion of the graphical program 300 that is exported to the hardware description 304. If the entire graphical program is not exported to the hardware description, then a portion of the program may execute on the general purpose CPU of the computer system. This portion preferably comprises the supervisory control and display portion of the program. Details follow on how the execution of the FPGA portion is coordinated with the execution of the main CPU portion and how the external hardware resource requirements for the FPGA portion are managed.

Figure 12:
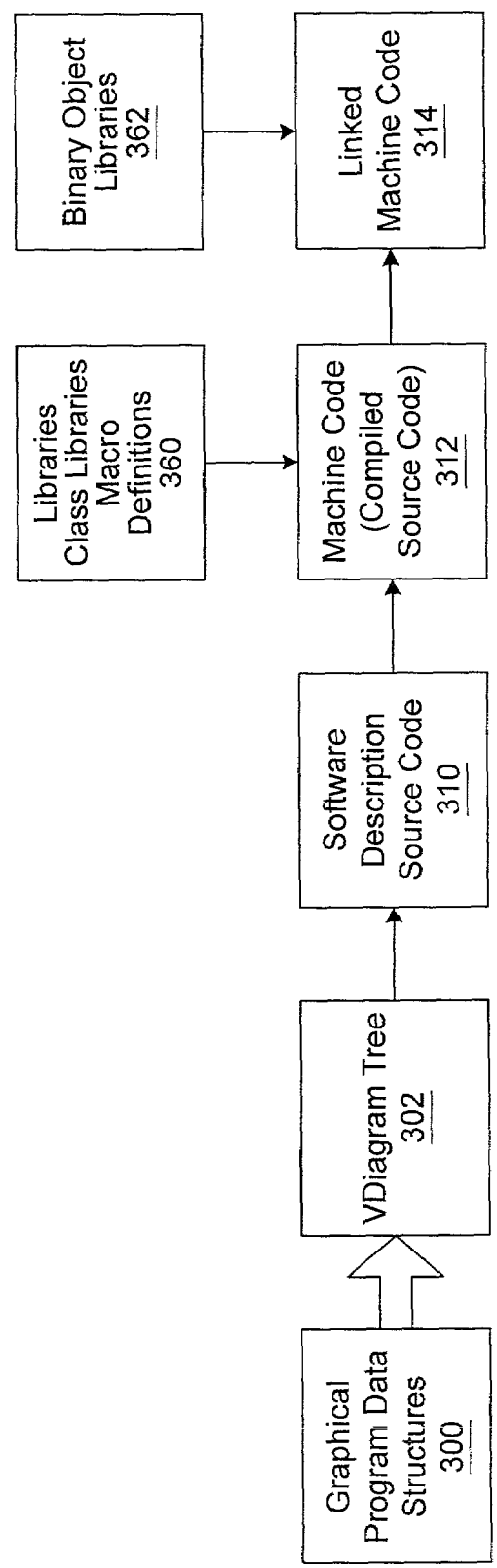
FIG. 12 illustrates the conversion of a graphical program into a software source code description and the compilation and linkage of the source code.

FIG. 12—Block Diagram of Conversion of a Graphical Program into a Software Source Code Description with Compilation and Linkage FIG. 12 illustrates the exportation of at least a portion of a graphical program 300 into a software source code description and the compilation and linkage of the source code. As shown, the graphical program data structures may be first converted to a VDiagram tree 302 and then to software description source code 310.

As described above for FIG. 10, in the preferred embodiment the VDiagram tree 302 references library components to represent various functional components of the graphical program. These library components may be implemented in libraries, class libraries, macro definitions, etc. 360. As shown in FIG. 12, these class libraries, etc. may be used to produce the machine code 312 from the source code 310. Also, binary object libraries 362 may implement some functionality of the software description. These binary object libraries may be linked in with the machine code 312 is linked to produce the linked executable code 314. Libraries 360 and 362 may also contain compiler-specific or platform-specific information necessary to produce executable code 314. Linked code 314 may be executed to perform the operations of the portion of the graphical program that is exported to the software source code description 310.

Figure 13:
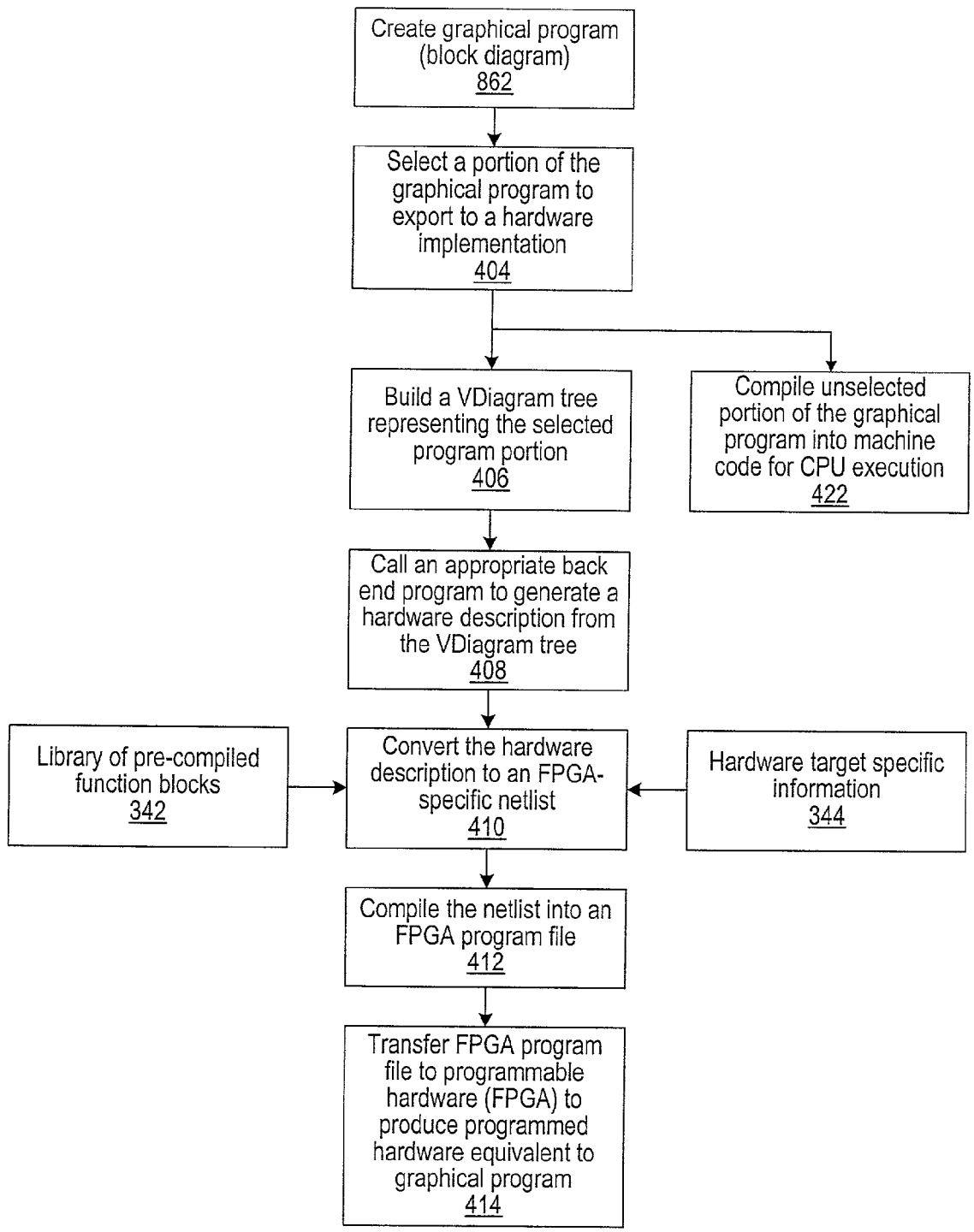
FIG. 13 is a flowchart diagram illustrating operation of one embodiment of the invention, including compiling a first portion of the graphical program into machine language and converting a second portion of the graphical program into a hardware implementation.

FIG. 13—Conversion of a Graphical Program into a Hardware Implementation

FIG. 13 is a flowchart diagram illustrating operation of one embodiment of the present invention. One embodiment of the present invention comprises a computer-implemented method for generating hardware and/or software implementations of graphical programs or graphical code. It is noted that various of the steps in the flowchart can occur concurrently or in different orders.

One goal of the present invention is to provide a development environment that will seamlessly allow use of a graphical programming system to design applications for reconfigurable or programmable hardware. In the preferred embodiment where the graphical programming system is LabVIEW, the present invention allows LabVIEW users to design applications in LabVIEW for reconfigurable hardware.

Many applications, such as signal processing and real-time motion control, are easily implemented in a graphical programming language, such as the LabVIEW G language. However, in some instances traditional software compilation methods cannot produce an application that is fast enough to meet a user's needs. The present invention solves this problem by allowing a user to convert their graphical program, e.g., a G program, into application-specific hardware such as a programmed FPGA. The hardware maintains the exact functionality of the graphical program while running at speeds far exceeding that of traditional general-purpose processor platforms. One current implementation of the present invention is a desktop or embedded PC that contains an FPGA-based and/or processor based card or board.

In one embodiment, the system appears as a conventional graphical programming system while providing a seamless interface to the reconfigurable hardware. For example, the preferred embodiment of the invention, referred to as "FPGA LabVIEW", provides a seamless interface to an FPGA. FPGA LabVIEW appears from the outside to be exactly the same as the normal LabVIEW graphical program development system.

FIG. 13 illustrates one embodiment of the translation process from a graphical program to a hardware description that corresponds to the graphical program. A graphical programming application that is being targeted for a hardware implementation is designed in the same way as an ordinary graphical programming application. As shown, in step 862 the user first creates a graphical program, also sometimes referred to as a block diagram. As described above, a design may be entered and debugged in the traditional software-based manner. In one embodiment, the graphical program comprises a graphical data flow diagram which specifies functionality of the program to be performed. This graphical data flow diagram is preferably directly compilable into machine language code for execution on a computer system.

When the design is finalized, the user can instruct the system to compile the design for the FPGA hardware. Unfortunately, some graphical programming constructs may not be efficiently implemented in FPGA hardware. For example, file I/O is a task that is usually better left to the general-purpose host processor. The present system in one embodiment is capable of bisecting a design into hardware portions and software portions.

Steps 404—414 are an example implementation of step 866 of FIG. 8A.

In step 404, the user may optionally select a first portion of the graphical program for conversion to a hardware implementation. This first portion of the graphical program which is desired for hardware implementation preferably comprises portions of the graphical program, e.g., particular subprograms, which require a fast or deterministic implementation and/or are desired to execute in a stand-alone hardware unit. In general, portions of the graphical program which are desired to have a faster or more deterministic execution are selected in step 404 and converted into the hardware implementation in steps 406–414. A default case is that the entire block diagram portion of the graphical program is selected for hardware implementation.

In step 422 the remaining portions of the graphical program which were not selected in step 404, if any, may be compiled into machine code for execution on a CPU, such as the host processor in the computer 102 or the processor 212 comprised on the interface card 134. The first portion of the program selected in step 404 preferably excludes program portions involving supervisory control and display. This enables the supervisory control and display portions to execute on the host CPU, which is optimal for these elements of the program.

In one embodiment, during creation of the graphical program in step 862 the user may specify portions, e.g. subprograms, which are to be exported to the hardware description format for conversion into a hardware implementation. In another embodiment the user selects which modules or subprograms to export to the hardware implementation at the time when the conversion process is initiated. In another embodiment, the entire graphical program may be selected for conversion to a hardware implementation, and thus step 422 may not be performed.

In step 406 the graphical program portion selected in step 404 may first be processed to create an abstract hardware graph called a VDiagram tree, described above, which serves as an intermediate data structure. The VDiagram tree may contain a complete hardware representation of the program, but is not specific to any hardware description language. For example, the VDiagram tree may comprise data structures representing hardware signals that implement the data flow within the graphical program, as well as data structures representing hardware signals that are added to preserve the proper execution flow (enable signals).

In step 408, a back end program may be called to parse the VDiagram tree and generate a hardware description from it. The back end may translate the information contained in the VDiagram tree into a specific hardware description language. For example, a VHDL back end may be called to generate a VHDL file or set of files describing the program. The hardware description comprises a high-level hardware description of function blocks, logic, inputs, and outputs which perform the operation indicated by the portion of the graphical program selected in step 404.

Various types of back end programs may be present. Back end programs may generate software source code descriptions as well as hardware description language descriptions. For example, FIG. 10 illustrates a back end 330A which uses the VDiagram tree to generate one or more VHDL files; back end 330B which generates one or more EDIF files; and back end 330C which generates one or more C files. These three back ends are representative only. Other back ends may generate other types of descriptions for the program. For example, a Verilog back end may generate a Verilog file for the program. Also, more than one back end may be called to generate different program descriptions. In the preferred embodiment, a VHDL back end generates a VHDL description which may then be compiled and used to program a programmable logic device such as an FPGA.

In step 410 the method may operate to convert the hardware description into an FPGA-specific netlist. The netlist describes the components required to be present in the hardware as well as their interconnections. Conversion of the hardware description into the FPGA-specific netlist is preferably performed by any of various types of commercially available synthesis tools, such as those available from Xilinx, Altera, etc.

In one embodiment, the converting step 410 may utilize one or more precompiled function blocks from a library of pre-compiled function blocks 342. Thus, for certain function blocks which are difficult to compile, or less efficient to compile, from a hardware description into a netlist format, the hardware description created in step 408 includes a reference to a pre-compiled function block from the library 342. Alternatively, hardware implementations for all of the function blocks are included in the function library. The respective pre-compiled function blocks are simply inserted into the netlist in place of these references in step 410. The preferred embodiment of the invention thus includes the library 342 of pre-compiled function blocks, also referred to as the component library, which are used in creating the netlist. The preferred embodiment also includes hardware target specific information 344 which is used by step 410 in converting the hardware description into a netlist which is specific to a certain type or class of FPGA.

In step 412 the method may operate to compile the netlist into an FPGA program file, also referred to as a software bit stream. The FPGA program file is a file that can be readily uploaded to program an FPGA.

After the netlist has been compiled into an FPGA program file in step 412, then in step 414 the method may operate to transfer the FPGA program file to the FPGA, to produce a programmed hardware equivalent to the graphical program. Thus, upon completion of step 414, the portion of a graphical program referenced in step 404 is comprised as a hardware implementation in an FPGA or other programmable hardware element.

In the preferred embodiment, the hardware description is passed transparently through the FPGA vendor's synthesis tools. Because the vendor's tools may take a considerable amount of time to process the design and generate a programming bitstream, it is recommended that this only be done after the design has been debugged using traditional software-compilation techniques.

As described above, the present invention may run on PC computers equipped with an FPGA-based expansion card on the PCI bus. Embodiments of the FPGA-based expansion card were described with reference to FIGS. 5A–5C (and possibly 6A–6D). The graphical programming system may upload the programming bitstream generated by the FPGA vendor's design tools into the FPGA on this board. The FPGA then may begin processing data, and the graphical programming system may coordinate data flow between the FPGA and the host CPU.

It is noted that various of the above steps can be combined and/or can be made to appear invisible to the user. For example, steps 410 and 412 can be combined into a single step, as can steps 404–410. In the preferred embodiment, after the user creates the graphical program in step 402, the user simply selects a hardware export option and indicates the hardware target or destination, causing steps 404–414 to be automatically performed.

FIG. 13 applies to the preferred embodiment in which the programmable hardware element is an FPGA. However, the same or similar steps may be applied to convert a graphical program into a hardware implementation for other types of programmable or (re)configurable hardware, such as a CPLD.

Figure 14:
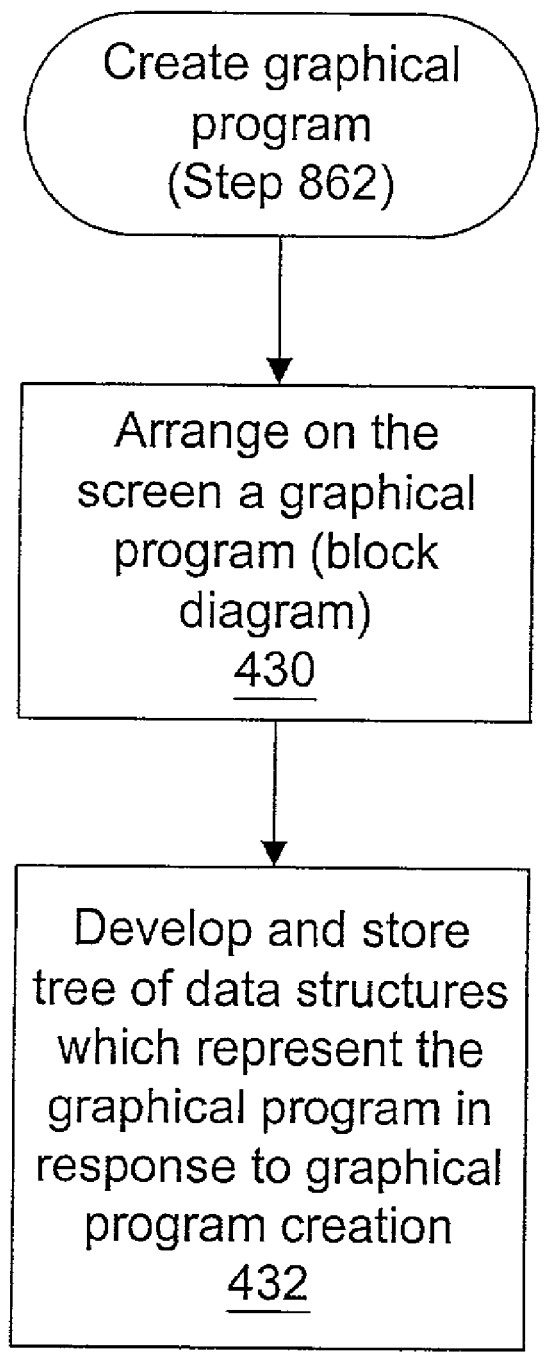
FIG. 14 is a flowchart diagram illustrating creation of a graphical program according to the preferred embodiment.

FIG. 14—Creation of a Graphical Program

FIG. 14 is a more detailed flowchart diagram of step 862 of FIGS. 8A and 13, illustrating creation of a graphical program according to one embodiment of the invention. As shown, in step 430 the user may arrange on a screen (i.e., a display device) a graphical program or block diagram. This may include the user placing and connecting, e.g., wiring, various icons or nodes on the display screen in order to configure a graphical program. More specifically, the user may select various function icons or other icons and place or drop the icons in a block diagram panel, and then connect or "wire up" the icons to assemble the graphical program. The user may also assemble a user interface, which may be referred to as a front panel, comprising controls and indicators which indicate or represent input/output to/from the graphical program. A graphical program targeted to measurement or automation applications may be referred to as a virtual instrument (VI). The graphical program or VI may have a hierarchy of sub-graphical programs or sub-VIs.

In the preferred embodiment, the graphical programming system is the LabVIEW graphical programming system available from National Instruments. For more information on creating a graphical program in the LabVIEW graphical programming system, please refer to the LabVIEW system available from National Instruments as well as the above patent applications incorporated by reference.

In response to the user arranging on the screen a graphical program, the method may operate in step 432 to develop and store a tree of data structures which represent the graphical program. Thus, as the user places and arranges on the screen function nodes, structure nodes, input/output terminals, and connections or wires, etc., the graphical programming system may operate to develop and store a tree of data structures which represent the graphical program. More specifically, as the user assembles each individual node and wire, the graphical programming system may operate to develop and store (or populate) a corresponding data structure in the tree of data structures which represents the individual portion of the graphical program that was assembled. Thus, steps 430 and 432 may be an iterative process which is repetitively performed as the user creates the graphical program. In one embodiment, the graphical programming system may automatically develop and store VDiagram data structures in response to the user creating the graphical program.

In an alternate embodiment, as the user places, arranges and interconnects nodes on the display, scripts, DLLs, or other code may be created in memory.

In one embodiment, the user may optionally place constructs in the graphical program which indicate respective portions of graphical code which are either to be compiled into machine code for execution by a CPU or converted to a hardware description for implementation in a programmable hardware device such as an FPGA.

Thus, the various methods described above may operate to deploy a graphical program implementing a function, such as an image processing or machine vision function, onto a programmable or configurable device, such as an image acquisition device, e.g., an image acquisition board or smart camera, thereby enabling the device to perform the function.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A computer-implemented method for configuring an image acquisition device to perform an image processing function, the method comprising:
    creating a graphical program on a computer system, wherein the graphical program implements the image processing function, and wherein the graphical program comprises a plurality of interconnected nodes which visually indicate functionality of the graphical program;
    deploying the graphical program on the image acquisition device, wherein the image acquisition device includes a processor and a memory, wherein the image acquisition device is coupled to or comprised in the computer system;
    wherein said deploying the graphical program on the image acquisition device comprises:
        generating an executable program based on the graphical program, wherein the executable program implements functionality of the graphical program; and
        transferring the executable program to the memory on the image acquisition device;
    the method further comprising:
        the image acquisition device acquiring an image of an object; and
        the image acquisition device executing to perform the image processing function on the image, wherein said image acquisition device executing to perform the image processing function on the image comprises the processor in the image acquisition device executing the executable program from the memory.

2. The method of claim 1, further comprising:
the image acquisition device receiving an image present signal;
wherein the image acquisition device acquires the image of the object in response to receiving the image present signal.

3. The method of claim 1, further comprising:
the image acquisition device performing a control operation after said executing to perform the image processing function on the image.

4. The method of claim 1, further comprising:
the image acquisition device generating a pass/fail indication after said executing to perform the image processing function on the image.

5. The method of claim 1,
wherein the image acquisition device is coupled to a camera; and
wherein the image acquisition device acquiring an image of an object comprises the camera acquiring the image of the object and the image acquisition device receiving and storing the image.

6. The method of claim 1,
wherein said executing further comprises:
the image acquisition device determining characteristics of the image after performing the image processing function; and
the image acquisition device performing an operation based on the determined characteristics of the image.

7. The method of claim 1,
wherein the image acquisition device comprises a smart camera.

8. The method of claim 1,
wherein the image acquisition device comprises an image acquisition board coupled to or comprised in a computer system.

9. The method of claim 1,
wherein the graphical program includes a user interface portion;
the method further comprising:
presenting the user interface portion on a display during the image acquisition device executing to perform the image processing function on the image.

10. The method of claim 9,
wherein the user interface portion operates as a front panel for the image acquisition device.

11. The method of claim 9, further comprising:
receiving user input to the user interface portion on the display to control the image acquisition device during the processor in the image acquisition device executing to perform the image processing function on the image.

12. The method of claim 9, further comprising:

compiling the user interface portion into executable code for execution by a first processor and storing the executable code in a first memory; and the first processor executing the executable code from the first memory to present the user interface portion on the display.

13. The method of claim 12, wherein the image acquisition device includes the first processor and the first memory; and wherein the first processor in the image acquisition device executes the executable code from the first memory to present the user interface portion on the display during the image acquisition device executing to perform the image processing function on the image.

14. The method of claim 12, wherein the computer system includes the first processor and the first memory; and wherein the computer system executes the executable code from the first memory to present the user interface portion on the display during the image acquisition device executing to perform the image processing function on the image.

15. The method of claim 1, wherein said creating the graphical program includes:

arranging on a display of the computer system a plurality of nodes comprising the graphical program and interconnecting the plurality of nodes;

creating and storing data structures which represent the graphical program in response to said arranging and said interconnecting.

16. The method of claim 1, wherein the graphical program comprises a data flow diagram.

17. The method of claim 1, wherein the graphical program comprises one or more of data flow, control flow and execution flow constructs.

18. The method of claim 1, wherein said creating the graphical program is performed on the computer system;

wherein the image acquisition device is coupled to the computer system over a network; and wherein said deploying the graphical program comprises the computer system deploying the graphical program over the network to the image acquisition device.

19. An image processing system, comprising:

a computer system comprising a processor, memory and a display;

wherein the memory stores a graphical program, wherein the graphical program implements an image processing function, wherein the graphical program comprises a plurality of interconnected nodes which visually indicate functionality of the graphical program; and wherein the memory also stores a software program which is executable to deploy the graphical program on the image acquisition device; and an image acquisition device coupled to the computer system, wherein the image acquisition device includes:

an input for acquiring an image; and at least one functional unit that is configurable based on the graphical program for performing the image processing function on the image, wherein the at least one functional unit comprises a second processor and a second memory;

wherein the software program is executable by the processor in the computer system to transfer the graphical program to the second memory on the image acquisition device; and wherein the second processor in the image acquisition device is operable to execute the graphical program from the second memory.

20. The image processing system of claim 19, wherein the image acquisition device is operable to receive an image present signal; and wherein the image acquisition device is operable to acquire the image of the object in response to receiving the image present signal.

21. The image processing system of claim 19, wherein the image acquisition device is operable to perform a control operation after executing to perform the image processing function on the image.

22. The image processing system of claim 19, wherein the image acquisition device is operable to generate a pass/fail indication after executing to perform the image processing function on the image.

23. The image processing system of claim 19, wherein the image acquisition device is coupled to a camera; and wherein the image acquisition device is operable to receive and store an image acquired from the camera.

24. The image processing system of claim 19, wherein the image acquisition device is operable to determine characteristics of the image after performing the image processing function; and wherein the image acquisition device is operable to perform an operation based on the determined characteristics of the image.

25. The image processing system of claim 19, wherein the image acquisition device comprises a smart camera.

26. The image processing system of claim 19, wherein the image acquisition device comprises an image acquisition board coupled to or comprised in a computer system.

27. The image processing system of claim 19, wherein the graphical program includes a user interface portion; and wherein the computer system is operable to present the user interface portion on a display when the at least one functional unit in the image acquisition device executes to perform the image processing function on the image.

28. The image processing system of claim 27, wherein the user interface portion operates as a front panel for the image acquisition device.

29. The image processing system of claim 27, wherein the computer system further comprises a user input device for receiving user input to the user interface portion on the display; and wherein the user input is operable to control the image acquisition device when the at least one functional unit in the image acquisition device executes to perform the image processing function on the image.

30. The image processing system of claim 27, wherein the user interface portion is operable to be compiled into executable code for execution by the processor and stored in the memory; and wherein the processor is operable to execute the executable code from the memory to present the user interface portion on the display.

31. The image processing system of claim 19,
wherein the memory of the computer system stores a graphical program development program for creating the graphical program;
wherein the graphical program development program is executable to:
arrange on the screen a plurality of nodes comprising the graphical program and interconnect the plurality of nodes in response to user input; and
create and store data structures which represent the graphical program in response to said user input.

32. The image processing system of claim 19, wherein the graphical program comprises one or more of data flow, control flow and execution flow constructs.

33. The image processing system of claim 19,
wherein the image acquisition device is coupled to the computer system over a network; and
wherein the computer system is operable to deploy the graphical program over the network to the image acquisition device.

34. An image acquisition device, comprising:
an input for receiving an image of an object;
a memory coupled to the input for storing data corresponding to the image of the object;
a programmable hardware element coupled to the memory that is configured to implement an image processing function, wherein the programmable hardware element in the image acquisition device is configured utilizing a hardware description generated from a graphical program, wherein the programmable hardware element implements a hardware implementation of the graphical program, wherein the programmable hardware element in the image acquisition device is operable to perform an image processing function on the image; and
analog to digital conversion logic coupled to the input and to the programmable hardware element for performing analog to digital conversion logic on an acquired analog image to produce a digital image.

35. The image acquisition device of claim 34,
wherein the graphical program comprises a plurality of interconnected nodes which visually indicate functionality of the graphical program.

36. The image acquisition device of claim 34,
wherein the graphical program is created by assembling a plurality of interconnected nodes which visually indicate functionality of the graphical program in response to user input.

37. A method for configuring an image acquisition device to perform an image processing function, the method comprising:
coupling the image acquisition device to a computer system, wherein the image acquisition device comprises at least one functional unit, wherein the functional unit is a processor and memory, wherein the computer system stores a graphical program, wherein the graphical program implements the image processing function; and
deploying the graphical program onto the functional unit in the image acquisition device to configure the functional unit, wherein said deploying the graphical program onto the functional unit comprises:
generating an executable program based on the graphical program, wherein the executable program implements functionality of the graphical program; and
transferring the executable program to the memory on the image acquisition device wherein the processor in the image acquisition device is operable to execute the executable program from the memory; and
wherein after said deploying the functional unit is operable to implement the graphical program.

38. The method of claim 37, further comprising:
disconnecting the image acquisition device from the computer system after said deploying.

39. The method of claim 37, further comprising:
creating the graphical program prior to said deploying, wherein the graphical program comprises a plurality of interconnected nodes which visually indicate functionality of the graphical program.

40. The method of claim 37,
wherein said deploying the graphical program onto the functional unit further comprises transferring the graphical program to the memory of the functional unit; and
wherein the processor in the image acquisition device is operable to execute the graphical program from the memory.

41. A computer-implemented method for configuring a smart camera to perform an image processing function, the method comprising:
creating a graphical program on a computer system, wherein the graphical program implements the image processing function, wherein the graphical program comprises a plurality of interconnected nodes which visually indicate functionality of the graphical program;
deploying the graphical program on the smart camera, wherein the smart camera is coupled to the computer system;
the smart camera acquiring an image of an object; and
the smart camera executing to perform the image processing function on the image;
wherein the smart camera includes a processor and a memory;
wherein said deploying the graphical program on the smart camera comprises:
generating an executable program based on the graphical program, wherein the executable program implements functionality of the graphical program; and
transferring the executable program to the memory on the smart camera; and
wherein said smart camera executing to perform the image processing function on the image comprises the processor in the smart camera executing the executable program from the memory.

42. The method of claim 41,
wherein said deploying the graphical program on the smart camera comprises transferring the graphical program to the memory on the smart camera; and
wherein said smart camera executing to perform the image processing function on the image comprises the processor in the smart camera executing the graphical program from the memory.

43. The method of claim 41, further comprising:
the smart camera receiving an image present signal;
wherein the smart camera acquires the image of the object in response to receiving the image present signal.

44. The method of claim 41, further comprising:
the smart camera performing a control operation after said executing to perform the image processing function on the image.

45. The method of claim 41, further comprising:
the smart camera generating a pass/fail indication after said executing to perform the image processing function on the image.

46. The method of claim 41,
wherein the smart camera acquiring an image of an object comprises the smart camera acquiring the image of the object and storing the image in a memory.

47. The method of claim 41,
wherein said executing further comprises:
the smart camera determining characteristics of the image after performing the image processing function; and
the smart camera performing an operation based on the determined characteristics of the image.

48. The method of claim 41,
wherein the graphical program includes a user interface portion;
the method further comprising:
presenting the user interface portion on a display during the smart camera executing to perform the image processing function on the image.

49. The method of claim 48,
wherein the user interface portion operates as a front panel for the smart camera.

50. The method of claim 48, further comprising:
receiving user input to the user interface portion on the display to control the smart camera during the processor in the smart camera executing to perform the image processing function on the image.

51. The method of claim 48, further comprising:
compiling the user interface portion into executable code for execution by a processor and storing the executable code in a memory; and
the processor executing the executable code from the memory to present the user interface portion on the display.

52. The method of claim 51,
wherein the processor in the smart camera executes the executable code from the memory to present the user interface portion on the display during the smart camera executing to perform the image processing function on the image.

53. The method of claim 51,
wherein the computer system includes the processor and the memory; and
wherein the computer system executes the executable code from the memory to present the user interface portion on the display during the smart camera executing to perform the image processing function on the image.

54. The method of claim 41, wherein said creating the graphical program includes:
arranging on a display of the computer system a plurality of nodes comprising the graphical program and interconnecting the plurality of nodes; and
creating and storing data structures which represent the graphical program in response to said arranging and said interconnecting.

55. The method of claim 41, wherein the graphical program comprises a data flow diagram.

56. The method of claim 41, wherein the graphical program comprises one or more of data flow, control flow and execution flow constructs.

57. The method of claim 41,
wherein said creating the graphical program is performed on the computer system;
wherein the smart camera is coupled to the computer system over a network; and
wherein said deploying the graphical program comprises the computer system deploying the graphical program over the network to the smart camera.

58. An image processing system, comprising:
a computer system comprising a processor, memory and a display; and
a smart camera coupled to the computer system, wherein the smart camera includes:
a camera for acquiring an image; and
at least one functional unit coupled to the camera that is configurable based on the graphical program for performing the image processing function on the image, wherein the at least one functional unit comprises a second processor and a second memory;
wherein the memory of the computer system stores a graphical program, wherein the graphical program implements as image processing function, and wherein the graphical program comprises a plurality of interconnected nodes which visually indicate functionality of the graphical program;
wherein the memory of the computer system also stores a software program which is executable to deploy the graphical program to the smart camera;
wherein the software program is executable by the processor in the computer system to transfer the graphical program to the second memory on the smart camera; and
wherein the second processor in the smart camera is operable to execute the graphical program from the second memory.

59. The image processing system of claim 58,
wherein the smart camera is operable to receive an image present signal; and
wherein the smart camera is operable to acquire the image of the object in response to receiving the image present signal.

60. The image processing system of claim 58,
wherein the smart camera is operable to perform a control operation after executing to perform the image processing function on the image.

61. The image processing system of claim 58,
wherein the smart camera includes a memory for storing an acquired image.

62. The image processing system of claim 58,
wherein the smart camera is operable to determine characteristics of the image after performing the image processing function; and
wherein the smart camera is operable to perform an operation based on the determined characteristics of the image.

63. The image processing system of claim 58,
wherein the graphical program includes a user interface portion; and
wherein the computer system is operable to present the user interface portion on a display when the at least one functional unit in the smart camera executes to perform the image processing function on the image.

64. The image processing system of claim 63,
wherein the user interface portion operates as a front panel for the smart camera.

65. The image processing system of claim 63,
wherein the computer system further comprises a user input device for receiving user input to the user interface portion on the display; and wherein the user input is operable to control the smart camera when the at least one functional unit in the smart camera executes to perform the image processing function on the image.

66. The image processing system of claim 63,
wherein the user interface portion is operable to be compiled into executable code for execution by the processor and stored in the memory; and
wherein the processor is operable to execute the executable code from the memory to present the user interface portion on the display.

67. The image processing system of claim 58,
wherein the memory of the computer system stores a graphical program development program for creating the graphical program; and
wherein the graphical program development program is executable to:
arrange on the screen a plurality of nodes comprising the graphical program and interconnect the plurality of nodes in response to user input; and
create and store data structures which represent the graphical program in response to said user input.

68. The image processing system of claim 58, wherein the graphical program comprises one or more of data flow, control flow and execution flow constructs.

69. The image processing system of claim 58,
wherein the smart camera is coupled to the computer system over a network; and
wherein the computer system is operable to deploy the graphical program over the network to the smart camera.

70. A smart camera, comprising:
a camera for receiving an image of an object;
a memory coupled to the camera for storing data corresponding to the image of the object;
a programmable hardware element coupled to the memory that is configured to implement an image processing function, wherein the programmable hardware element in the smart camera is configured utilizing a hardware description generated from a graphical program, wherein the programmable hardware element implements a hardware implementation of the graphical program, and wherein the programmable hardware element in the smart camera is operable to perform an image processing function on the image; and
analog to digital conversion logic coupled to the input and to the programmable hardware element for performing analog to digital conversion logic on an acquired analog image to produce a digital image.

71. The smart camera of claim 70,
wherein the graphical program comprises a plurality of interconnected nodes which visually indicate functionality of the graphical program.

72. The smart camera of claim 70,
wherein the graphical program is created by assembling a plurality of interconnected nodes which visually indicate functionality of the graphical program in response to user input.

73. A method for configuring a smart camera to perform an image processing function, the method comprising:
coupling the smart camera to a computer system, wherein the smart camera comprises at least one functional unit, wherein the functional unit is a processor and memory, wherein the computer system stores a graphical program, wherein the graphical program implements the image processing function; and
deploying the graphical program onto the functional unit in the smart camera to configure the functional unit, wherein said deploying the graphical program onto the functional unit comprises:
generating an executable program based on the graphical program, wherein the executable program implements functionality of the graphical program; and
transferring the executable program to the memory on the smart camera;
wherein after said deploying the functional unit is operable to implement the graphical program; and
wherein the processor in the smart camera is operable to execute the executable program from the memory.

74. The method of claim 73, further comprising:
disconnecting the smart camera from the computer system after said deploying.

75. The method of claim 73, further comprising:
creating the graphical program prior to said deploying, wherein the graphical program comprises a plurality of interconnected nodes which visually indicate functionality of the graphical program.

76. The method of claim 73,
wherein said deploying the graphical program onto the functional unit comprises transferring the graphical program to the memory of the functional unit; and
wherein the processor in the smart camera is operable to execute the graphical program from the memory.

77. A computer-implemented method for configuring an image acquisition device to perform an image processing function, the method comprising:
creating a graphical program on a computer system, wherein the graphical program implements the image processing function, and wherein the graphical program comprises a plurality of interconnected nodes which visually indicate functionality of the graphical program;
deploying the graphical program on the image acquisition device, wherein the image acquisition device includes a programmable hardware element, wherein the image acquisition device is coupled to or comprised in the computer system;
the image acquisition device acquiring an image of an object; and
the image acquisition device executing to perform the image processing function on the image;
wherein said deploying the graphical program on the image acquisition device comprises:
generating a hardware description based on the graphical program, wherein the hardware description describes a hardware implementation of the graphical program; and
configuring the programmable hardware element in the image acquisition device utilizing the hardware description, wherein after said configuring the programmable hardware element implements a hardware implementation of the graphical program; and
wherein said image acquisition device executing to perform the image processing function on the image comprises the programmable hardware element in the image acquisition device executing to perform the image processing function on the image.

78. A computer-implemented method for configuring an image acquisition device to perform an image processing function, the method comprising:
creating a graphical program on a computer system, wherein the graphical program implements the image processing function, and wherein the graphical program comprises a plurality of interconnected nodes which visually indicate functionality of the graphical program;

deploying the graphical program on the image acquisition device, wherein the image acquisition device includes a processor and a memory and a programmable hardware element, wherein the image acquisition device is coupled to or comprised in the computer system;

the image acquisition device acquiring an image of an object; and the image acquisition device executing to perform the image processing function on the image;

wherein said deploying the graphical program on the image acquisition device comprises:

transferring a first portion of the graphical program to the memory on the image acquisition device;

generating a hardware description based on a second portion of the graphical program, wherein the hardware description describes a hardware implementation of the second portion of the graphical program; and configuring the programmable hardware element in the image acquisition device utilizing the hardware description, wherein after said configuring the programmable hardware element implements a hardware implementation of the second portion of the graphical program; and wherein said image acquisition device executing to perform the image processing function on the image comprises the processor in the image acquisition device executing the first portion of the graphical program from the memory and the programmable hardware element executing the second portion of the graphical program.

79. The method of claim 78, wherein the first portion of the graphical program comprises an image processing portion, and wherein the second portion of the graphical program comprises a control portion.

80. The method of claim 79, wherein the first portion of the graphical program comprises a control portion, and wherein the second portion of the graphical program comprises an image processing portion.

81. A computer-implemented method for configuring an image acquisition device to perform an image processing function, the method comprising:

creating a graphical program on a computer system, wherein the graphical program implements the image processing function, and wherein the graphical program comprises a plurality of interconnected nodes which visually indicate functionality of the graphical program;

deploying the graphical program on the image acquisition device, wherein the image acquisition device includes a processor and a memory and a programmable hardware element, wherein the image acquisition device is coupled to or comprised in the computer system;

the image acquisition device acquiring an image of an object; and the image acquisition device executing to perform the image processing function on the image;

wherein said deploying the graphical program on the image acquisition device comprises:

generating an executable program based on a first portion of the graphical program, wherein the executable program implements functionality of the first portion of the graphical program; and transferring the executable program to the memory on the image acquisition device;

generating a hardware description based on a second portion of the graphical program, wherein the hardware description describes a hardware implementation of the graphical program; and configuring the programmable hardware element in the image acquisition device utilizing the hardware description, wherein after said configuring the programmable hardware element implements a hardware implementation of the second portion of the graphical program; and wherein said image acquisition device executing to perform the image processing function on the image comprises the processor in the image acquisition device executing the executable program from the memory and the programmable hardware element executing the second portion of the graphical program.

82. The method of claim 81, wherein the first portion of the graphical program comprises an image processing portion, and wherein the second portion of the graphical program comprises a control portion.

83. The method of claim 81, wherein the first portion of the graphical program comprises a control portion, and wherein the second portion of the graphical program comprises an image processing portion.

84. A computer-implemented method for configuring an image acquisition device to perform an image processing function, the method comprising:

creating a graphical program on a computer system, wherein the graphical program implements the image processing function, and wherein the graphical program comprises a plurality of interconnected nodes which visually indicate functionality of the graphical program;

deploying the graphical program on the image acquisition device, wherein the image acquisition device includes a first processor, a second processor, and at least one memory, wherein the image acquisition device is coupled to or comprised in the computer system;

the image acquisition device acquiring an image of an object; and the image acquisition device executing to perform the image processing function on the image.

wherein said image acquisition device executing to perform the image processing function on the image comprises the first processor in the image acquisition device executing a first portion of the graphical program from the at least one memory and the second processor in the image acquisition device executing a second portion of the graphical program from the at least one memory.

85. The method of claim 84, wherein the first portion of the graphical program comprises an image processing portion, and wherein the second portion of the graphical program comprises a control portion.

86. The method of claim 84, wherein the first portion of the graphical program comprises a first portion of the image processing function, and wherein the second portion of the graphical program comprises a second portion of the image processing function.

87. A computer-implemented method for configuring an image acquisition device to perform an image processing function, the method comprising:
- creating a graphical program on a computer system, wherein the graphical program implements the image processing function, and wherein the graphical program comprises a plurality of interconnected nodes which visually indicate functionality of the graphical program;
- deploying the graphical program on the image acquisition device, wherein the image acquisition device is coupled to or comprised in the computer system;
- the image acquisition device acquiring an image of an object;
- the image acquisition device executing to perform the image processing function on the image; and
- the image acquisition device generating a pass/fail indication after said executing to perform the image processing function on the image.

88. A computer-implemented method for configuring an image acquisition device to perform an image processing function, the method comprising:
- creating a graphical program on a computer system, wherein the graphical program implements the image processing function, wherein the graphical program includes a user interface portion, and wherein the graphical program comprises a plurality of interconnected nodes which visually indicate functionality of the graphical program;
- deploying the graphical program on the image acquisition device, wherein the image acquisition device is coupled to or comprised in the computer system;
- the image acquisition device acquiring an image of an object;
- the image acquisition device executing to perform the image processing function on the image; and
- presenting the user interface portion on a display during the image acquisition device executing to perform the image processing function on the image;
- wherein the user interface portion operates as a front panel for the image acquisition device.

89. A computer-implemented method for configuring an image acquisition device to perform an image processing function, the method comprising:
- creating a graphical program on a computer system, wherein the graphical program implements the image processing function, wherein the graphical program includes a user interface portion, and wherein the graphical program comprises a plurality of interconnected nodes which visually indicate functionality of the graphical program;
- deploying the graphical program on the image acquisition device, wherein the image acquisition device is coupled to or comprised in the computer system;
- the image acquisition device acquiring an image of an object;
- the image acquisition device executing to perform the image processing function on the image;
- presenting the user interface portion on a display during the image acquisition device executing to perform the image processing function on the image;
- compiling the user interface portion into executable code for execution by a processor and storing the executable code in a memory; and
- the processor executing the executable code from the memory to present the user interface portion on the display.

90. The method of claim 89,
- wherein the image acquisition device includes the processor and the memory; and
- wherein the processor in the image acquisition device executes the executable code from the memory to present the user interface portion on the display during the image acquisition device executing to perform the image processing function on the image.

91. The method of claim 89,
- wherein the computer system includes the processor and the memory; and
- wherein the computer system executes the executable code from the memory to present the user interface portion on the display during the image acquisition device executing to perform the image processing function on the image.

92. An image processing system, comprising:
- a computer system comprising a processor, memory and a display; and
- an image acquisition device coupled to the computer system, wherein the image acquisition device includes:
  - an input for acquiring an image; and
  - at least one functional unit that is configurable based on the graphical program for performing the image processing function on the image, wherein the at least one functional unit comprises a second processor and a second memory;
- wherein the memory of the computer system stores a graphical program, wherein the graphical program implements an image processing function, wherein the graphical program comprises a plurality of interconnected nodes which visually indicate functionality of the graphical program;
- wherein the memory of the computer system also stores a software program which is executable to deploy the graphical program on the image acquisition device;
- wherein the software program is executable by the processor in the computer system to 1) generate an executable program based on the graphical program, wherein the executable program implements functionality of the graphical program, and 2) transfer the executable program to the second memory on the image acquisition device; and
- wherein the second processor in the image acquisition device is operable to execute the executable program from the second memory.

93. An image processing system, comprising:
- a computer system comprising a processor, memory and a display; and
- an image acquisition device coupled to the computer system, wherein the image acquisition device includes:
  - an input for acquiring an image; and
  - at least one functional unit that is configurable based on the graphical program for performing the image processing function on the image, wherein the at least one functional unit comprises a programmable hardware element;
- wherein the memory of the computer system stores a graphical program, wherein the graphical program implements an image processing function, wherein the graphical program comprises a plurality of interconnected nodes which visually indicate functionality of the graphical program;
- wherein the memory of the computer system also stores a software program which is executable to deploy the graphical program on the image acquisition device; and wherein the software program is executable by the processor in the computer system to generate a hardware description based on the graphical program and configure the programmable hardware element based on the hardware description, wherein after being configured the programmable hardware element, implements a hardware implementation of the graphical program, wherein the programmable hardware element in the image acquisition device is executable to perform an image processing function on an acquired image.

94. An image processing system, comprising:
a computer system comprising a processor, memory and a display; and
an image acquisition device coupled to the computer system, wherein the image acquisition device includes:
an input for acquiring an image; and
at least one functional unit that is configurable based on the graphical program for performing the image processing function on the image, wherein the at least one functional unit comprises a second processor, a second memory, and a programmable hardware element;
wherein the memory of the computer system stores a graphical program, wherein the graphical program implements an image processing function, wherein the graphical program comprises a plurality of interconnected nodes which visually indicate functionality of the graphical program;
wherein the memory of the computer system also stores a software program which is executable to deploy the graphical program on the image acquisition device;
wherein the software program is executable by the processor in the computer system to:
transfer a first portion of the graphical program to the second memory on the image acquisition device;
generate a hardware description based on a second portion of the graphical program, wherein the hardware description describes a hardware implementation of the second portion of the graphical program; and
configure the programmable hardware element in the image acquisition device utilizing the hardware description, wherein after said configuring the programmable hardware element implements a hardware implementation of the second portion of the graphical program;
wherein the second processor in the image acquisition device is operable to execute the first portion of the graphical program from the second memory; and
wherein the programmable hardware element in the image acquisition device is operable to implement the second portion of the graphical program.

95. The image processing system of claim 94,
wherein the first portion of the graphical program comprises an image processing portion, and wherein the second portion of the graphical program comprises a control portion.

96. The image processing system of claim 94,
wherein the first portion of the graphical program comprises a control portion, and wherein the second portion of the graphical program comprises an image processing portion.

97. An image processing system, comprising:
a computer system comprising a processor, memory and a display; and
an image acquisition device coupled to the computer system, wherein the image acquisition device includes:
an input for acquiring an image; and
at least one functional unit that is configurable based on the graphical program for performing the image processing function on the image, wherein the at least one functional unit comprises a second processor, a second memory, and a programmable hardware element;
wherein the memory of the computer system stores a graphical program, wherein the graphical program implements an image processing function, wherein the graphical program comprises a plurality of interconnected nodes which visually indicate functionality of the graphical program;
wherein the memory of the computer system also stores a software program which is executable to deploy the graphical program on the image acquisition device;
wherein the software program is executable by the processor in the computer system to:
generate an executable program based on a first portion of the graphical program, wherein the executable program implements functionality of the first portion of the graphical program;
transfer the executable program to the second memory on the image acquisition device;
generate a hardware description based on a second portion of the graphical program, wherein the hardware description describes a hardware implementation of the second portion of the graphical program; and
configure the programmable hardware element in the image acquisition device utilizing the hardware description, wherein after said configuring the programmable hardware element implements a hardware implementation of the second portion of the graphical program;
wherein the second processor in the image acquisition device is operable to execute the executable program from the second memory to implement the first portion of the graphical program; and
wherein the programmable hardware element in the image acquisition device is operable to implement the second portion of the graphical program.

98. The image processing system of claim 97,
wherein the first portion of the graphical program comprises an image processing portion, and wherein the second portion of the graphical program comprises a control portion.

99. The image processing system of claim 96,
wherein the first portion of the graphical program comprises a control portion, and wherein the second portion of the graphical program comprises an image processing portion.

100. An image processing system, comprising:
a computer system comprising a processor, memory and a display; and
an image acquisition device coupled to the computer system, wherein the image acquisition device includes:
an input for acquiring an image; and
at least one functional unit that is configurable based on the graphical program for performing the image processing function on the image, wherein the at least one functional unit comprises a second processor, a third processor, and at least one memory;
wherein the memory of the computer system stores a graphical program, wherein the graphical program implements an image processing function, wherein the graphical program comprises a plurality of interconnected nodes which visually indicate functionality of the graphical program;

wherein the memory of the computer system also stores a software program which is executable to deploy the graphical program on the image acquisition device; and wherein the second processor in the image acquisition device is operable to execute a first portion of the graphical program from the at least one memory and the third processor in the image acquisition device is operable to execute a second portion of the graphical program from the at least one memory.

101. The image processing system of claim 100, wherein the first portion of the graphical program comprises an image processing portion, and wherein the second portion of the graphical program comprises a control portion.

102. The image processing system of claim 100, wherein the first portion of the graphical program comprises a first portion of the image processing function, and wherein the second portion of the graphical program comprises a second portion of the image processing function.

103. An image processing system, comprising:

a computer system comprising a processor, memory and a display; and an image acquisition device coupled to the computer system, wherein the image acquisition device includes:
an input for acquiring an image; and
at least one functional unit that is configurable based on the graphical program for performing the image processing function on the image;

wherein the memory of the computer system stores a graphical program, wherein the graphical program implements an image processing function, wherein the graphical program comprises a plurality of interconnected nodes which visually indicate functionality of the graphical program;

wherein the memory of the computer system also stores a software program which is executable to deploy the graphical program on the image acquisition device; and wherein the image acquisition device is operable to generate a pass/fail indication after executing to perform the image processing function on the image.

104. An image processing system, comprising:

a computer system comprising a processor, memory and a display; and an image acquisition device coupled to the computer system, wherein the image acquisition device includes:
an input for acquiring an image; and
at least one functional unit that is configurable based on the graphical program for performing the image processing function on the image;

wherein the memory of the computer system stores a graphical program, wherein the graphical program implements an image processing function, wherein the graphical program includes a user interface portion, wherein the graphical program comprises a plurality of interconnected nodes which visually indicate functionality of the graphical program;

wherein the memory of the computer system also stores a software program which is executable to deploy the graphical program on the image acquisition device;

wherein the computer system is operable to present the user interface portion on a display when the at least one functional unit in the image acquisition device executes to perform the image processing function on the image; and wherein the user interface portion operates as a front panel for the image acquisition device.

105. An image processing system, comprising:

a computer system comprising a processor, memory and a display; and an image acquisition device coupled to the computer system, wherein the image acquisition device includes:
an input for acquiring an image; and
at least one functional unit that is configurable based on the graphical program for performing the image processing function on the image;

wherein the memory of the computer system stores a graphical program, wherein the graphical program implements an image processing function, wherein the graphical program includes a user interface portion, wherein the graphical program comprises a plurality of interconnected nodes which visually indicate functionality of the graphical program; and wherein the memory of the computer system also stores a software program which is executable to deploy the graphical program on the image acquisition device;

wherein the user interface portion is operable to be compiled into executable code for execution by the processor and stored in the memory;

wherein the processor is operable to execute the executable code from the memory to present the user interface portion on the display; and wherein the computer system is operable to present the user interface portion on a display when the at least one functional unit in the image acquisition device executes to perform the image processing function on the image.

106. An image acquisition device, comprising:

an input for receiving an image of an object;

a memory coupled to the input for storing data corresponding to the image of the object;

a programmable hardware element coupled to the memory that is configured to implement an image processing function, wherein the programmable hardware element in the image acquisition device is configured utilizing a hardware description generated from a graphical program, wherein the programmable hardware element implements a hardware implementation of the graphical program, wherein the programmable hardware element in the image acquisition device is operable to perform an image processing function on the image; and timer/counter logic, wherein the timer/counter logic performs one of timing/counting operations while the programmable hardware element in the image acquisition device executes to perform the image processing function on the image.

107. The image acquisition device of claim 106, wherein the graphical program comprises a plurality of interconnected nodes which visually indicate functionality of the graphical program.

108. An image acquisition device, comprising:

an input for receiving an image of an object;

a memory coupled to the input for storing data corresponding to the image of the object; and a programmable hardware element coupled to the memory that is configured to implement an image processing function, wherein the programmable hardware element in the image acquisition device is configured utilizing a hardware description generated from a graphical program, wherein the programmable hardware element implements a hardware implementation of the graphical program, wherein the programmable hardware element in the image acquisition device is operable to perform an image processing function on the image, wherein the programmable hardware element comprises a field programmable gate array (FPGA).

109. The image acquisition device of claim 108, wherein the graphical program comprises a plurality of interconnected nodes which visually indicate functionality of the graphical program.

110. An image acquisition device, comprising:
an input for receiving an image of an object;
a memory coupled to the input for storing data corresponding to the image of the object;
a programmable hardware element coupled to the memory that is configured to implement an image processing function, wherein the programmable hardware element in the image acquisition device is configured utilizing a hardware description generated from a graphical program, wherein the programmable hardware element implements a hardware implementation of the graphical program, wherein the programmable hardware element in the image acquisition device is operable to perform an image processing function on the image; and
a non-volatile memory coupled to the programmable hardware element, wherein the non-volatile memory is operable to store the hardware description, wherein the non-volatile memory is further operable to transfer the hardware description to the programmable hardware element to configure the programmable hardware element.

111. The image acquisition device of claim 110, wherein the graphical program comprises a plurality of interconnected nodes which visually indicate functionality of the graphical program.

112. A method for configuring an image acquisition device to perform an image processing function, the method comprising:
coupling the image acquisition device to a computer system, wherein the image acquisition device comprises at least one functional unit, wherein the functional unit is a programmable hardware element, wherein the computer system stores a graphical program, wherein the graphical program implements the image processing function; and
deploying the graphical program onto the functional unit in the image acquisition device to configure the functional unit, wherein said deploying the graphical program onto the functional unit comprises:
downloading a hardware configuration onto the programmable hardware element in the image acquisition device to configure the programmable hardware element, wherein the hardware configuration corresponds to a hardware implementation of the graphical program, wherein after said downloading the programmable hardware element implements a hardware implementation of the graphical program;
wherein after said deploying the functional unit is operable to implement the graphical program.

113. The method of claim 112, further comprising:
creating the graphical program prior to said deploying, wherein the graphical program comprises a plurality of interconnected nodes which visually indicate functionality of the graphical program.

114. The method of claim 112, further comprising:
disconnecting the image acquisition device from the computer system after said deploying.

115. A computer-implemented method for configuring a smart camera to perform an image processing function, the method comprising:
creating a graphical program on a computer system, wherein the graphical program implements the image processing function, wherein the graphical program comprises a plurality of interconnected nodes which visually indicate functionality of the graphical program;
deploying the graphical program on the smart camera, wherein the smart camera is coupled to the computer system;
the smart camera acquiring an image of an object; and
the smart camera executing to perform the image processing function on the image;
wherein the smart camera includes a programmable hardware element;
wherein said deploying the graphical program on the smart camera comprises:
generating a hardware description based on the graphical program, wherein the hardware description describes a hardware implementation of the graphical program; and
configuring the programmable hardware element in the smart camera utilizing the hardware description, wherein after said configuring the programmable hardware element implements a hardware implementation of the graphical program; and
wherein said smart camera executing to perform the image processing function on the image comprises the programmable hardware element in the smart camera executing to perform the image processing function on the image.

116. A computer-implemented method for configuring a smart camera to perform an image processing function, the method comprising:
creating a graphical program on a computer system, wherein the graphical program implements the image processing function, wherein the graphical program comprises a plurality of interconnected nodes which visually indicate functionality of the graphical program;
deploying the graphical program on the smart camera, wherein the smart camera is coupled to the computer system;
the smart camera acquiring an image of an object; and
the smart camera executing to perform the image processing function on the image;
wherein the smart camera includes a processor and a memory and a programmable hardware element;
wherein said deploying the graphical program on the smart camera comprises:
transferring a first portion of the graphical program to the memory on the smart camera;
generating a hardware description based on a second portion of the graphical program, wherein the hardware description describes a hardware implementation of the second portion of the graphical program; and
configuring the programmable hardware element in the smart camera utilizing the hardware description, wherein after said configuring the programmable hardware element implements a hardware implementation of the second portion of the graphical program; and wherein said smart camera executing to perform the image processing function on the image comprises the processor in the smart camera executing the first portion of the graphical program from the memory and the programmable hardware element executing the second portion of the graphical program.

117. The method of claim 116,
wherein the first portion of the graphical program comprises an image processing portion, and wherein the second portion of the graphical program comprises a control portion.

118. The method of claim 116,
wherein the first portion of the graphical program comprises a control portion, and wherein the second portion of the graphical program comprises an image processing portion.

119. A computer-implemented method for configuring a smart camera to perform an image processing function, the method comprising:
creating a graphical program on a computer system, wherein the graphical program implements the image processing function, wherein the graphical program comprises a plurality of interconnected nodes which visually indicate functionality of the graphical program;
deploying the graphical program on the smart camera, wherein the smart camera is coupled to the computer system;
the smart camera acquiring an image of an object; and
the smart camera executing to perform the image processing function on the image;
wherein the smart camera includes a processor and a memory and a programmable hardware element;
wherein said deploying the graphical program on the smart camera comprises:
generating an executable program based on a first portion of the graphical program, wherein the executable program implements functionality of the first portion of the graphical program;
transferring the executable program to the memory on the smart camera;
generating a hardware description based on a second portion of the graphical program, wherein the hardware description describes a hardware implementation of the second portion of the graphical program; and
configuring the programmable hardware element in the smart camera utilizing the hardware description, wherein after said configuring the programmable hardware element implements a hardware implementation of the second portion of the graphical program; and
wherein the smart camera executing to perform the image processing function on the image comprises the processor in the smart camera executing the executable program from the memory and the programmable hardware element executing the second portion of the graphical program.

120. The method of claim 119,
wherein the first portion of the graphical program comprises an image processing portion, and wherein the second portion of the graphical program comprises a control portion.

121. The method of claim 119,
wherein the first portion of the graphical program comprises a control portion, and wherein the second portion of the graphical program comprises an image processing portion.

122. A computer-implemented method for configuring a smart camera to perform an image processing function, the method comprising:
creating a graphical program on a computer system, wherein the graphical program implements the image processing function, wherein the graphical program comprises a plurality of interconnected nodes which visually indicate functionality of the graphical program;
deploying the graphical program on the smart camera, wherein the smart camera is coupled to the computer system;
the smart camera acquiring an image of an object; and
the smart camera executing to perform the image processing function on the image;
wherein the smart camera includes a first processor, a second processor, and at least one memory; and
wherein said smart camera executing to perform the image processing function on the image comprises the first processor in the smart camera executing a first portion of the graphical program from the at least one memory and the second processor in the smart camera executing a second portion of the graphical program from the at least one memory.

123. The method of claim 122,
wherein the first portion of the graphical program comprises an image processing portion, and wherein the second portion of the graphical program comprises a control portion.

124. The method of claim 122,
wherein the first portion of the graphical program comprises a first portion of the image processing function, and wherein the second portion of the graphical program comprises a second portion of the image processing function.

125. A computer-implemented method for configuring a smart camera to perform an image processing function, the method comprising:
creating a graphical program on a computer system, wherein the graphical program implements the image processing function, wherein the graphical program includes a user interface portion, wherein the graphical program comprises a plurality of interconnected nodes which visually indicate functionality of the graphical program;
deploying the graphical program on the smart camera, wherein the smart camera is coupled to the computer system;
the smart camera acquiring an image of an object;
the smart camera executing to perform the image processing function on the image; and
presenting the user interface portion on a display during the smart camera executing to perform the image processing function on the image;
wherein the user interface portion operates as a front panel for the smart camera.

126. A computer-implemented method for configuring a smart camera to perform an image processing function, the method comprising:
creating a graphical program on a computer system, wherein the graphical program implements the image processing function, wherein the graphical program includes a user interface portion, wherein the graphical program comprises a plurality of interconnected nodes which visually indicate functionality of the graphical program;

compiling the user interface portion into executable code for execution by a processor and storing the executable code in a memory deploying the graphical program on the smart camera, wherein the smart camera is coupled to the computer system;

the smart camera acquiring an image of an object;

the smart camera executing to perform the image processing function on the image;

the processor executing the executable code from the memory to present the user interface portion on the display; and presenting the user interface portion on a display during the smart camera executing to perform the image processing function on the image.

127. The method of claim 126, wherein the smart camera includes the processor and the memory; and wherein the processor in the smart camera executes the executable code from the memory to present the user interface portion on the display during the smart camera executing to perform the image processing function on the image.

128. The method of claim 126, wherein the computer system includes the processor and the memory; and wherein the computer system executes the executable code from the memory to present the user interface portion on the display during the smart camera executing to perform the image processing function on the image.

129. An image processing system, comprising:

a computer system comprising a processor, memory and a display; and a smart camera coupled to the computer system, wherein the smart camera includes:

a camera for acquiring an image; and at least one functional unit coupled to the camera that is configurable based on the graphical program for performing the image processing function on the image, wherein the at least one functional unit comprises a second processor and a second memory;

wherein the memory of the computer system stores a graphical program, wherein the graphical program implements an image processing function, and wherein the graphical program comprises a plurality of interconnected nodes which visually indicate functionality of the graphical program; and wherein the memory of the computer system also stores a software program which is executable to deploy the graphical program to the smart camera;

wherein the software program is executable by the processor in the computer system to 1) generate an executable program based on the graphical program, wherein the executable program implements functionality of the graphical program, and 2) transfer the graphical program to the second memory of the at least one functional unit; and wherein the second processor of the at least one functional unit is operable to execute the executable program from the second memory of the at least one functional unit.

130. An image processing system, comprising:

a computer system comprising a processor, memory and a display; and a smart camera coupled to the computer system, wherein the smart camera includes:

a camera for acquiring an image; and at least one functional unit coupled to the camera that is configurable based on the graphical program for performing the image processing function on the image, wherein the at least one functional unit comprises a programmable hardware element;

wherein the memory of the computer system stores a graphical program, wherein the graphical program implements an image processing function, and wherein the graphical program comprises a plurality of interconnected nodes which visually indicate functionality of the graphical program; and wherein the memory of the computer system also stores a software program which is executable to deploy the graphical program to the smart camera; and wherein the software program is executable by the processor in the computer system to generate a hardware description based on the graphical program and configure the programmable hardware element based on the hardware description, wherein after being configured the programmable hardware element implements a hardware implementation of the graphical program, and wherein the programmable hardware element in the smart camera is executable to perform an image processing function on an acquired image.

131. An image processing system, comprising:

a computer system comprising a processor, memory and a display; and a smart camera coupled to the computer system, wherein the smart camera includes:

a camera for acquiring an image; and at least one functional unit coupled to the camera that is configurable based on the graphical program for performing the image processing function on the image, wherein the at least one functional unit comprises a second processor, a second memory, and a programmable hardware element;

wherein the memory of the computer system stores a graphical program, wherein the graphical program implements an image processing function, and wherein the graphical program comprises a plurality of interconnected nodes which visually indicate functionality of the graphical program;

wherein the memory of the computer system also stores a software program which is executable to deploy the graphical program to the smart camera; wherein the software program is executable by the processor in the computer system to:

transfer a first portion of the graphical program to the second memory the smart camera;

generate a hardware description based on a second portion of the graphical program, wherein the hardware description describes a hardware implementation of the second portion of the graphical program; and configure the programmable hardware element in the smart camera utilizing the hardware description, wherein after said configuring the programmable hardware element implements a hardware implementation of the second portion of the graphical program;

wherein the second processor in the smart camera is operable to execute the first portion of the graphical program from the second memory; and wherein the programmable hardware element in the smart camera is operable to implement the second portion of the graphical program.

132. The image processing system of claim 131, wherein the first portion of the graphical program comprises an image processing portion, and wherein the second portion of the graphical program comprises a control portion.

133. The image processing system of claim 131, wherein the first portion of the graphical program comprises a control portion, and wherein the second portion of the graphical program comprises an image processing portion.

134. An image processing system, comprising:

a computer system comprising a processor, memory and a display; and a smart camera coupled to the computer system, wherein the smart camera includes:
  a camera for acquiring an image; and
  at least one functional unit coupled to the camera that is configurable based on the graphical program for performing the image processing function on the image, wherein the at least one functional unit comprises a second processor, a second memory, and a programmable hardware element;

wherein the memory of the computer system stores a graphical program, wherein the graphical program implements an image processing function, and wherein the graphical program comprises a plurality of interconnected nodes which visually indicate functionality of the graphical program;

wherein the memory of the computer system also stores a software program which is executable to deploy the graphical program to the smart camera;

wherein the software program is executable by the processor in the computer system to:
  generate an executable program based on a first portion of the graphical program, wherein the executable program implements functionality of the first portion of the graphical program;
  transfer the executable program to the second memory on the smart camera;
  generate a hardware description based on a second portion of the graphical program, wherein the hardware description describes a hardware implementation of the second portion of the graphical program; and
  configure the programmable hardware element in the smart camera utilizing the hardware description, wherein after said configuring the programmable hardware element implements a hardware implementation of the second portion of the graphical program;

wherein the second processor in the smart camera is operable to execute the executable program from the second memory; and wherein the programmable hardware element in the smart camera is operable to implement the second portion of the graphical program.

135. The image processing system of claim 134, wherein the first portion of the graphical program comprises an image processing portion, and wherein the second portion of the graphical program comprises a control portion.

136. The image processing system of claim 134, wherein the first portion of the graphical program comprises a control portion, and wherein the second portion of the graphical program comprises an image processing portion.

137. An image processing system, comprising:

a computer system comprising a processor, memory and a display; and a smart camera coupled to the computer system, wherein the smart camera includes:
  a camera for acquiring an image; and
  at least one functional unit coupled to the camera that is configurable based on the graphical program for performing the image processing function on the image, wherein the at least one functional unit comprises a second processor, a third processor, and at least one memory;

wherein the memory of the computer system stores a graphical program, wherein the graphical program implements an image processing function, and wherein the graphical program comprises a plurality of interconnected nodes which visually indicate functionality of the graphical program;

wherein the memory of the computer system also stores a software program which is executable to deploy the graphical program on the smart camera; and wherein the second processor of the at least one functional unit is operable to execute a first portion of the graphical program from the at least one memory of the at least one functional unit and the third processor of the at least one functional unit is operable to execute a second portion of the graphical program from the at least one memory of the at least one functional unit.

138. The image processing system of claim 137, wherein the first portion of the graphical program comprises an image processing portion, and wherein the second portion of the graphical program comprises a control portion.

139. The image processing system of claim 137, wherein the first portion of the graphical program comprises a first portion of the image processing function, and wherein the second portion of the graphical program comprises a second portion of the image processing function.

140. An image processing system, comprising:

a computer system comprising a processor, memory and a display; and a smart camera coupled to the computer system, wherein the smart camera includes:
  a camera for acquiring an image; and
  at least one functional unit coupled to the camera that is configurable based on the graphical program for performing the image processing function on the image;

wherein the memory of the computer system stores a graphical program, wherein the graphical program implements an image processing function, and wherein the graphical program comprises a plurality of interconnected nodes which visually indicate functionality of the graphical program;

wherein the memory of the computer system also stores a software program which is executable to deploy the graphical program to the smart camera; and wherein the smart camera is operable to generate a pass/fail indication after executing to perform the image processing function on the image.

141. An image processing system, comprising:
a computer system comprising a processor, memory and a display; and
a smart camera coupled to the computer system, wherein the smart camera includes:
  a camera for acquiring an image; and
  at least one functional unit coupled to the camera that is configurable based on the graphical program for performing the image processing function on the image;
wherein the memory of the computer system stores a graphical program, wherein the graphical program implements an image processing function, wherein the graphical program includes a user interface portion, and wherein the graphical program comprises a plurality of interconnected nodes which visually indicate functionality of the graphical program;
wherein the memory of the computer system also stores a software program which is executable to deploy the graphical program to the smart camera;
wherein the computer system is operable to present the user interface portion on a display when the at least one functional unit in the smart camera executes to perform the image processing function on the image; and
wherein the user interface portion operates as a front panel for the smart camera.

142. An image processing system, comprising:
a computer system comprising a processor, memory and a display; and
a smart camera coupled to the computer system, wherein the smart camera includes:
  a camera for acquiring an image; and
  at least one functional unit coupled to the camera that is configurable based on the graphical program for performing the image processing function on the image;
wherein the memory of the computer system stores a graphical program, wherein the graphical program implements an image processing function, wherein the graphical program includes a user interface portion, and wherein the graphical program comprises a plurality of interconnected nodes which visually indicate functionality of the graphical program;
wherein the memory of the computer system also stores a software program which is executable to deploy the graphical program to the smart camera;
wherein the computer system is operable to present the user interface portion on a display when the at least one functional unit in the smart camera executes to perform the image processing function on the image;
wherein the user interface portion is operable to be compiled into executable code for execution by the processor of the computer system and stored in the memory of the computer system; and
wherein the processor of the computer system is operable to execute the executable code from the memory of the computer system to present the user interface portion on the display.

143. A smart camera, comprising:
a camera for receiving an image of an object;
a memory coupled to the camera for storing data corresponding to the image of the object;
a programmable hardware element coupled to the memory that is configured to implement an image processing function, wherein the programmable hardware element in the smart camera is configured utilizing a hardware description generated from a graphical program, wherein the programmable hardware element implements a hardware implementation of the graphical program, and wherein the programmable hardware element in the smart camera is operable to perform an image processing function on the image; and
timer/counter logic;
wherein the timer/counter logic performs one of timing/counting operations while the programmable hardware element in the smart camera executes to perform the image processing function on the image.

144. The smart camera of claim 143,
wherein the graphical program comprises a plurality of interconnected nodes which visually indicate functionality of the graphical program.

145. A smart camera, comprising:
a camera for receiving an image of an object;
a memory coupled to the camera for storing data corresponding to the image of the object; and
a programmable hardware element coupled to the memory that is configured to implement an image processing function, wherein the programmable hardware element in the smart camera is configured utilizing a hardware description generated from a graphical program, wherein the programmable hardware element implements a hardware implementation of the graphical program, and wherein the programmable hardware element in the smart camera is operable to perform an image processing function on the image;
wherein the programmable hardware element comprises a field programmable gate array (FPGA).

146. The smart camera of claim 145,
wherein the graphical program comprises a plurality of interconnected nodes which visually indicate functionality of the graphical program.

147. A smart camera, comprising:
a camera for receiving an image of an object;
a memory coupled to the camera for storing data corresponding to the image of the object;
a programmable hardware element coupled to the memory that is configured to implement an image processing function, wherein the programmable hardware element in the smart camera is configured utilizing a hardware description generated from a graphical program, wherein the programmable hardware element implements a hardware implementation of the graphical program, and wherein the programmable hardware element in the smart camera is operable to perform an image processing function on the image; and
a non-volatile memory coupled to the programmable hardware element;
wherein the non-volatile memory is operable to store the hardware description; and
wherein the non-volatile memory is further operable to transfer the hardware description to the programmable hardware element to configure the programmable hardware element.

148. The smart camera of claim 147,
wherein the graphical program comprises a plurality of interconnected nodes which visually indicate functionality of the graphical program.

149. A method for configuring a smart camera to perform an image processing function, the method comprising:
coupling the smart camera to a computer system, wherein the smart camera comprises at least one functional unit, wherein the functional unit is a programmable hardware element, wherein the computer system stores a graphical program, wherein the graphical program implements the image processing function; and deploying the graphical program onto the functional unit in the smart camera to configure the functional unit, wherein said deploying the graphical program onto the functional unit comprises:

downloading a hardware configuration onto the programmable hardware element in the smart camera to configure the programmable hardware element, wherein the hardware configuration corresponds to a hardware implementation of the graphical program;

wherein after said downloading the programmable hardware element implements a hardware implementation of the graphical program; and wherein after said deploying the functional unit is operable to implement the graphical program.

150. The method of claim 149, further comprising:

creating the graphical program prior to said deploying, wherein the graphical program comprises a plurality of interconnected nodes which visually indicate functionality of the graphical program.

151. The method of claim 149, further comprising:

disconnecting the smart camera from the computer system after said deploying.

* * * * *

UNITED STATES PATENT AND TRADEMARK OFFICE
CERTIFICATE OF CORRECTION

PATENT NO.   : 6,971,066 B1
DATED        : November 29, 2005
INVENTOR(S)  : Schultz et al.

It is certified that error appears in the above-identified patent and that said Letters Patent is hereby corrected as shown below:

Column 42,
Line 19, delete "implements as image" and substitute -- implements an image --.

Column 49,
Line 6, delete "hardware element, implements" and substitute -- hardware element implements --.

Signed and Sealed this

Seventh Day of March, 2006

JON W. DUDAS
*Director of the United States Patent and Trademark Office*